(12) United States Patent
Kim et al.

(10) Patent No.: US 10,653,021 B2
(45) Date of Patent: May 12, 2020

(54) TILED DISPLAY DEVICE AND TILING APPARATUS THEREFOR

(71) Applicant: LG Display Co., Ltd., Seoul (KR)

(72) Inventors: Hanseok Kim, Paju-si (KR); Sunghwan Yoon, Seoul (KR); Heejong Shin, Goyang-si (KR); Seungchul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/046,049

(22) Filed: Jul. 26, 2018

(65) Prior Publication Data

US 2019/0191574 A1 Jun. 20, 2019

(30) Foreign Application Priority Data

Dec. 15, 2017 (KR) .................. 10-2017-0173359
Dec. 15, 2017 (KR) .................. 10-2017-0173361

(Continued)

(51) Int. Cl.
*H05K 5/02* (2006.01)
*G09F 9/302* (2006.01)
(Continued)

(52) U.S. Cl.
CPC ......... *H05K 5/0204* (2013.01); *F16B 5/0664* (2013.01); *F16B 21/086* (2013.01);
(Continued)

(58) Field of Classification Search
CPC .. H05K 5/0204; H05K 5/0017; H05K 5/0021; G09F 9/3026; G06F 3/1446
See application file for complete search history.

(56) References Cited

U.S. PATENT DOCUMENTS 5,061,112 A 10/1991 Monford, Jr.
5,076,623 A 12/1991 Richards
(Continued)

FOREIGN PATENT DOCUMENTS

DE 10 2011 119475 A1 5/2013
JP 2015-210429 A 11/2015
(Continued)

OTHER PUBLICATIONS

Extended European Search Report issued in European Application No. 18182928.4 dated Jan. 21, 2019. Note: JP 2015 210429 A cited therein is already of record.
(Continued)

*Primary Examiner* — Daniel P Wicklund
*Assistant Examiner* — Douglas R Burtner
(74) *Attorney, Agent, or Firm* — Morgan, Lewis & Bockius LLP

(57) ABSTRACT

A display includes a display panel having elements that allow attachment to a mounting structure therebehind and in alignment with adjacent display panels that collectively form a tiled display screen that has multiple display panels connected to each other with effectively seamless bezels. The elements are configured to allow the display panel to be attached to or detached from the tiled display screen in a particular direction other than a side direction that would only allow for engagement from the sides of the adjacent display panels.

15 Claims, 18 Drawing Sheets

(30) Foreign Application Priority Data

Dec. 15, 2017 (KR) ........................ 10-2017-0173362
Dec. 15, 2017 (KR) ........................ 10-2017-0173363

(51) Int. Cl.
| | | |
|---|---|---|
| *F16B 5/06* | (2006.01) | |
| *F16B 21/08* | (2006.01) | |
| *H05K 5/00* | (2006.01) | |
| *F16B 1/00* | (2006.01) | |
| *G06F 3/14* | (2006.01) | |

(52) U.S. Cl.
CPC ......... *G09F 9/3026* (2013.01); *H05K 5/0017* (2013.01); *H05K 5/0021* (2013.01); *F16B 2001/0035* (2013.01); *G06F 3/1446* (2013.01)

(56) References Cited

U.S. PATENT DOCUMENTS

| | | | | |
|---|---|---|---|---|
| 9,311,836 | B1* | 4/2016 | van der Walde | ... G09F 15/0006 |
| 9,477,438 | B1* | 10/2016 | Hochman | ................. G09G 5/02 |
| 10,273,994 | B1* | 4/2019 | Foster | ................ G06F 3/1446 |
| 10,342,150 | B1* | 7/2019 | Davis | .................... B60K 37/04 |
| 2013/0078855 | A1* | 3/2013 | Hornick | ................ H01R 13/73 |
| | | | | 439/571 |
| 2014/0003052 | A1* | 1/2014 | Hemiller | ................. F21V 21/34 |
| | | | | 362/249.02 |
| 2016/0032952 | A1* | 2/2016 | McBroom | ............ F16B 21/165 |
| | | | | 24/303 |
| 2016/0210886 | A1* | 7/2016 | Brashnyk | .............. H01F 7/0252 |
| 2016/0348854 | A1* | 12/2016 | Wu | .......................... G09F 13/00 |
| 2017/0006727 | A1* | 1/2017 | Ryu | .................... H01L 25/0753 |
| 2017/0092401 | A1 | 3/2017 | Herman | |
| 2017/0114971 | A1* | 4/2017 | Cross | .................... G06F 3/1446 |
| 2017/0127539 | A1* | 5/2017 | Drabant | ............... H05K 5/0017 |
| 2017/0159876 | A1 | 6/2017 | Brashnyk et al. | |
| 2017/0220310 | A1* | 8/2017 | Hochman | ........... G06F 3/1446 |
| 2017/0286044 | A1* | 10/2017 | Kim | ..................... H01L 33/504 |
| 2018/0031919 | A1* | 2/2018 | Ryu | ....................... H01F 7/0252 |
| 2018/0120956 | A1* | 5/2018 | Yoo | ........................ H05K 1/147 |
| 2018/0359426 | A1* | 12/2018 | Adema | .................. G09F 9/3026 |
| 2019/0057799 | A1* | 2/2019 | Habeck | ..................... G09F 9/33 |
| 2019/0059166 | A1* | 2/2019 | Habeck | ................. G09F 9/3026 |
| 2019/0122592 | A1* | 4/2019 | Han | ..................... G09F 9/3026 |
| 2019/0179592 | A1* | 6/2019 | Hyeon | ..................... G09G 3/006 |
| 2019/0180673 | A1* | 6/2019 | Yoon | .................... G09F 9/3026 |
| 2019/0191577 | A1* | 6/2019 | Declerck | .............. G09F 27/005 |
| 2019/0208655 | A1* | 7/2019 | Schafer | ................. G09F 9/3026 |
| 2019/0350094 | A1* | 11/2019 | Miller | .................. H05K 5/0021 |

FOREIGN PATENT DOCUMENTS

| | | |
|---|---|---|
| KR | 10-2017-0000575 A | 1/2017 |
| KR | 10-2017-0143385 A | 12/2017 |
| WO | 2016/208918 A1 | 12/2016 |

OTHER PUBLICATIONS

Notice of Allowance dated Aug. 3, 2018, issued in corresponding Korean Patent Application No. 10-2017-0173359.

* cited by examiner

TILED DISPLAY DEVICE AND TILING APPARATUS THEREFOR

The present disclosure claims the benefit of Korean Patent Application No. 10-2017-0173359 filed on Dec. 15, 2017, Korean Patent Application No. 10-2017-0173361 filed on Dec. 15, 2017, Korean Patent Application No. 10-2017-0173362 filed on Dec. 15, 2017, and Korean Patent Application No. 10-2017-0173363 filed on Dec. 15, 2017, all of which are hereby incorporated by reference.

BACKGROUND

1. Technical Field

The present disclosure relates to a tiled display device and a tiling apparatus therefor.

2. Related Art

As consumers desire to receive and use more information, the demand for various types of display devices has increased. In order to meet these demands, recently, various display devices such as liquid crystal display (LCD) devices, organic light emitting diode (OLED) displays and micro-LED displays are being developed.

Such display devices have been used for various applications ranging from small-sized electronic devices used in mobile phones to large-sized electronic devices such as televisions.

Display devices are not limited to portable electronic devices or TVs. For example, display devices are used for large electronic display boards installed in stadiums to display information about sports events and large electronic display screens installed at other venues where many people gather. However, such electronic display boards or screens should be manufactured to be several hundreds of inches or more in size, and it is difficult to manufacture a a single display device of such size using current technology.

In order to cope with this problem, a method of providing a single display device is achieved through attachment or tiling of a plurality of display panels instead of manufacturing a large-sized display device on one substrate. Such a large-sized display device can be referred to as a tiled display device. In such a tiled display device, a plurality of display panels are tiled together such that a region where an image is not realized between display panels may be minimized or even eliminated and one image as a whole without viewable partition lines may be realized.

However, there are the following problems in such a conventional tiled display device.

First, since the tiled display device has a plurality of display panels attached together, when the gap between display panels is equal to or larger than a predetermined size, the seam at a boundary region may be undesirably perceived by viewers.

In particular, in order to fabricate a large-sized tiled display device of several hundreds of inches, the size of each display panel to be tiled should be as large as possible. In this regard, in the case of tiling such a large-sized display panel, it is difficult for a worker or installation staff to tile or attach each display panel at a precise position due to the weight thereof and thus the gap between display panels may be equal to or larger than the predetermined size.

Second, it takes a long time to assemble and disassemble the tiled display device.

The tiled display device may be always fixed at a predetermined location such as in a stadium, but may also be temporarily installed at an event place. The tiled display device is completed as the plurality of display panels are coupled by mechanical coupling elements such as screws. Therefore, in order to use the tiled display device as a temporary display device, it is necessary to quickly assemble and disassemble the tiled display device. However, because it takes a lot of time and effort (several days are required) to assemble and disassemble the display panels which are large-sized and heavy, with the coupling elements such as screws, inconvenience is caused in use.

SUMMARY

Accordingly, embodiments of the present disclosure are directed to a tiled display device and tiling apparatus that substantially obviate one or more of the problems due to limitations and disadvantages of the related art.

An aspect of the present disclosure is to provide a tiling apparatus capable of attaching and detaching a display panel by a magnetic force through attaching the display panel using a magnet.

Another aspect of the present disclosure is to provide a tiled display device capable of aligning a display panel with a plate and simply coupling the display panel and the plate, by constructing a coupling unit to be coupled with the plate, on the rear side of the display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a tiling apparatus may comprise: a frame; at least one first magnet disposed in the frame and attaching a display panel; at least one second magnet disposed in the frame and separating the attached display panel; a first driving member driven to move the first magnet toward the display panel; a second driving member driven to move the second magnet away from the display panel; a first pressure bar coupled with the first driving member and the first magnet; and a second pressure bar coupled with the second driving member and the second magnet.

In another aspect, a tiled display device may comprise: a plurality of display panels; a plate to which the plurality of display panels are tiled; a first coupling unit disposed on a rear side of each display panel; and a second coupling unit disposed on a front side of the plate and coupled with the first coupling unit, wherein the first coupling unit guides the second coupling unit, and at least one of the first coupling unit and the second coupling unit is provided with a magnet.

The first coupling unit may include a body having a cylindrical shape and guiding the second coupling unit inserted therein; and a coupling groove formed on an inner surface of the body. The second coupling unit may include a guide disposed on the plate and inserted into the body of the first coupling unit; a movable member disposed in the guide and moved by being inserted into the body of the first coupling unit; a first tiling magnet disposed on a distal end portion of the movable member and attaching the display panel; a receiving groove formed in the movable member; an elastic member disposed between the plate and the movable member; and a coupling member disposed in the guide and coupled into the coupling groove of the first coupling unit.

The first coupling unit may include a body having a cylindrical shape and guiding the second coupling unit inserted therein; a tiling magnet movably disposed in the body; a movable bar disposed along an inner circumference of the body and moved as the tiling magnet is moved; a coupling groove formed in the body; and an inclined portion formed at an end portion of the body to be inclined by a predetermined angle. The second coupling unit may include a pair coupling bars disposed on the plate, arranged parallel to each other and inserted into the body of the first coupling unit; a spring disposed between the pair of coupling bars; coupling protrusions formed on the pair of coupling bars, respectively, and coupled into the coupling groove of the first coupling unit; and distal end portions formed at distal end portions of the pair of coupling bars and inclined by a preselected angle.

In the embodiments, a tiling apparatus includes a first magnet for attaching a display panel and a second magnet for detaching the display panel, and, by actuating the first magnet and the second magnet through actuating driving members with a handle grasped, the display panel is attached to and detached from a tiled display device. Therefore, it is possible to quickly and easily disassemble the tiled display device without using additional mechanical coupling such as screwing.

Also, in the embodiments, since a first coupling unit which is disposed on the rear side of the display panel and a second coupling unit of a plate are insertion-coupled, the insertion coupling of the first coupling unit and the second coupling unit has an alignment function by itself. Thus, since tiled display panels retain a gap within a predetermined range, the seam between the display panels is practically not visible.

Moreover, in the embodiments, since the display panel and the plate are coupled by the magnets and the coupling members which are integrated with each other, a simple coupling structure may be obtained because additional coupling elements such as screws are not needed.

It is to be understood that both the foregoing general description and the following detailed description are exemplary and explanatory and are intended to provide further explanation of the inventive concepts as claimed.

DETAILED DESCRIPTION

Figure 1:
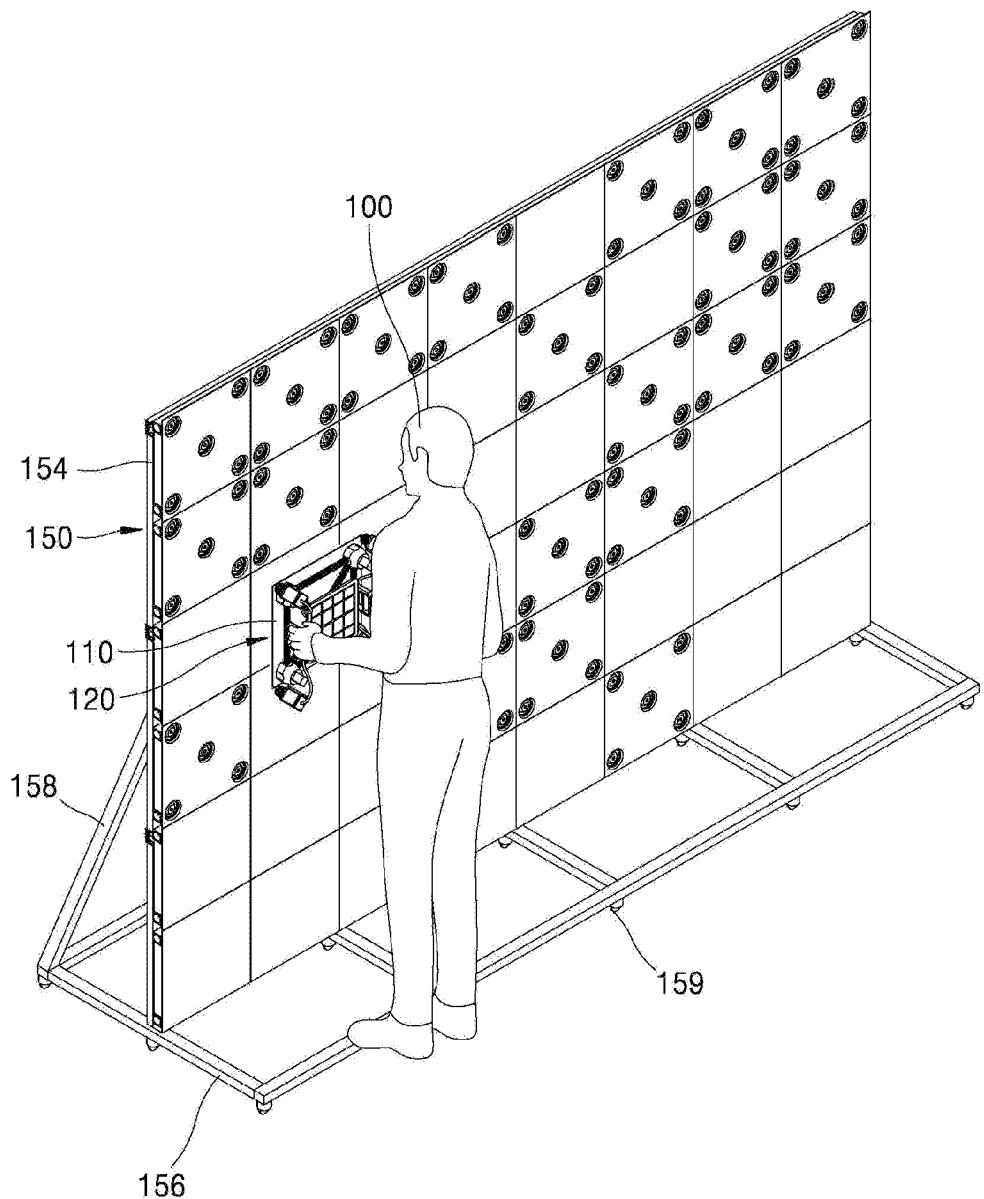
FIG. 1 is a view illustrating that a worker tiles a display panel in a tiled display device in accordance with the present disclosure.

Aspects and features of the present disclosure and methods to achieve them will become apparent from the descriptions of exemplary embodiments herein below with reference to the accompanying drawings. However, the present disclosure is not limited to the exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure can be defined by the claims.

The figures, dimensions, ratios, angles, numbers of elements given in the drawings are merely illustrative and are not limiting. Throughout the specification, like reference numerals refer to like elements. In describing the present disclosure, when it is determined that the detailed description of the known related art may obscure the gist of the present disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element Bi" and "an element A next to an element B," another element C may be disposed between the elements A and B unless the term "directly" or "immediately" is explicitly used.

When the description of the time sequential relation includes 'after', 'followed by', 'next', 'before', etc., non-continuous cases may be included unless "immediately" or "directly" is used.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various exemplary embodiments of the present disclosure may be combined partially or totally. Technically various interactions and operations are possible. Various exemplary embodiments can be practiced individually or in combination.

Hereinafter, various exemplary embodiments of the present disclosure will be described in detail with reference to the accompanying drawings.

FIG. 1 is a view conceptually illustrating that a worker tiles or attaches a display panel by a tiling apparatus in accordance with the present disclosure.

As shown in FIG. 1, in the present disclosure, a worker 100 assembles a tiled display device 150 by directly tiling a plurality of display panels 110. That is to say, as the worker 100 is positioned in front of the tiled display device 150 (in a direction in which an image is realized) and attaches each display panel 110 to the tiled display device 150 at the front side, the plurality of display panels 110 are tiled.

The tiled display device 150 is constructed by a plate 154 (or some other similar element) to which the plurality of display panels 110 are tiled, a first support 156 which is disposed under the plate 154 and supports the plate 154 from below, and a second support 158 which is fastened to the first support 156 and the rear side of the plate 154 while forming a predetermined angle and supports the plate 154 from the rear.

The plurality of display panels 110 are attached to the plate 154. Since the plurality of display panels 110 to be tiled collectively form one assembled display device, they may simultaneously display and realize one image according to the image processing signals applied thereto. The plurality of display panels 110 to be tiled may be isolated electrically such that different images are respectively displayed. Various wiring lines and electric cables may be disposed in the plate 154, electrically connect the plurality of display panels 110 with one another, and connect the tiled display device 150 with an external host to allow signals to be applied to the tiled display device 150.

The first support 156 and the second support 158 act to support the plate 154 and fix the tiled display device 150. While it is illustrated in the drawing that the first support 156 and the second support 158 are constructed in a pipe shape having a predetermined width and thickness, it is to be noted that the first support 156 and the second support 158 are not limited to such shapes and may be constructed in various forms.

A plurality of wheels 159 (or other elements with similar functionality) may be provided on the bottom side of the first support 156. In the case where the tiled display device 150 is used as a temporary display device at an event place, the tiled display device 150 may be moved to various locations as needed. When moving the tiled display device 150 from one place to another, it takes a lot of time and effort to disassemble the plurality of tiled display panels 110, move them to a new place and assemble them again.

Therefore, in the present disclosure, as moving means such as the wheels 159 are disposed on the bottom side of the first support 156, the tiled display device 150 may be moved by the moving means within a short distance. Also, in the case where a place at which the tiled display device 150 is to be installed is not suitable for a tiling work, such assembly may be performed at another place, and the finished tiled display device 150 may be moved by the wheels 159 and be installed at a desired place.

As will be described later, each display panel 110 is attached to the plate 154 by a magnetic force. In a conventional tiled display device, since each display panel is assembled to a plate by mechanical coupling elements such as screws, a worker has to position the display panel on the plate and then couple the screws by an additional process. Therefore, a work for tilling a plurality of display panels is substantially complicated. Moreover, the work for coupling the screws while positioning the heavy display panel on the plate cannot be performed by one worker and requires at least two workers working together.

Conversely, in the present disclosure, since each display panel 110 is simply attached to the plate 154 by using the magnetic force of magnets, as one worker positions each display panel 110 in front of the plate 154 and moves the display panel 110 toward the plate 154, the display panel 110 is attached to the plate 154 by a magnetic force without requiring an additional coupling process. Therefore, since the tiling work for the display panel 110 according to the present disclosure is much simpler than the tiling work for the conventional display panel, it is possible to quickly and simply perform assembly and disassembly.

Further, in the present disclosure, since particular guides are positioned on the rear side of each display panel 110, it is possible to precisely attach the display panel 110 at a desired position. If the display panels are not attached at precise positions, the boundaries between the plurality of tiled display panels are perceived by viewers. Accordingly, such seams or boundaries are perceived by viewers in the active area of the tiled display device 150. In order to prevent the occurrence of such seams, the display panels should be attached in a state in which they are accurately aligned by an alignment apparatus. However, since such an alignment apparatus is not only very expensive but also requires an additional alignment process, a tiling assembly requires a long time and thus assembly efficiency degrades. In addition, since an attachment process after the alignment process is performed manually by workers, there are still some limitations in precisely attaching the display panels even when the alignment apparatus is used.

In the present disclosure, since the guides are formed on the rear side of each display panel 110 and are used when attaching the display panel 110, it is possible to precisely attach the display panel 110 even without using an additional alignment apparatus.

As each display panel 110, various types of display panels may be used. For example, as the display panel 110 according to the present disclosure, various display panels such as liquid crystal display panels, organic electroluminescence display panels and LED display panels (including so-called micro-LED displays) may be used.

In particular, the micro-LED display panel is excellent in reliability by using not an organic material but an inorganic material as a light emitting element, and has a longer lifetime than a liquid crystal display panel or an organic electroluminescence display panel. Furthermore, the micro-LED display device is suitable for being applied to very large-sized window-like applications because it has a fast operation speed, low power consumption and excellent stability due to high impact resistance and is capable of displaying images of high brightness. Specifically, because the micro-LED display panel may have very small sized LEDs as light emitting elements, in the case where the tiled display device 150 is realized using micro-LED display panels, the gap between the LEDs of adjacent panels may be made equal to the gap between LEDs in each panel, and thus, it is possible to realize a zero bezel such that no substantial bezel region exists.

The tiled display device 150 may be tiled in units of display panel or by units of a so-called cabinet in which a plurality of display panels are assembled together. The cabinet unit will be described below with reference to FIGS. 2 and 3.

Figure 2:
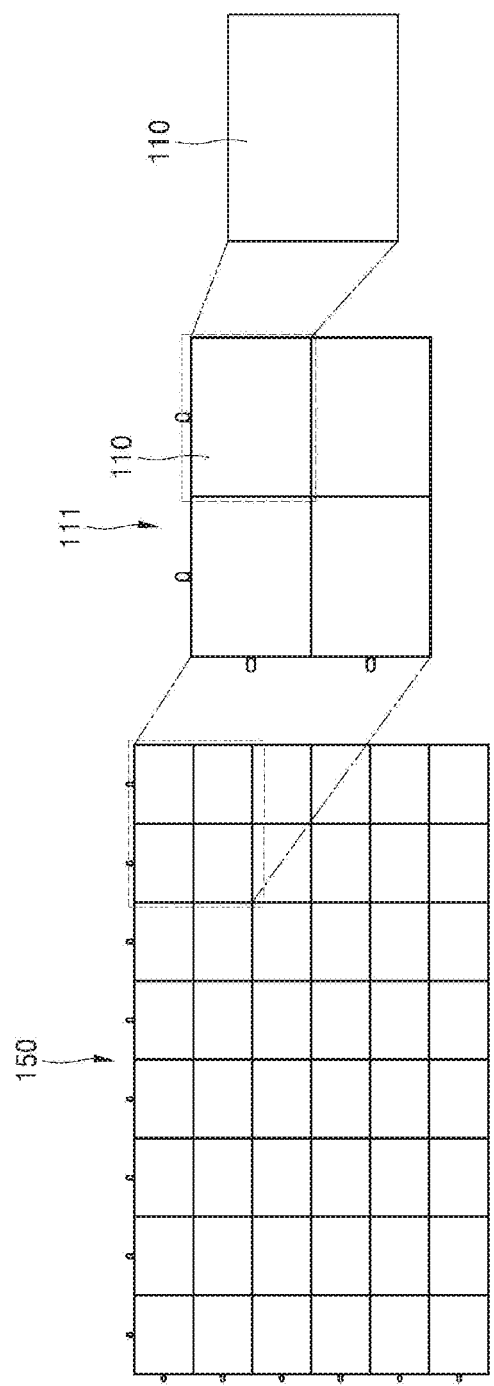
FIG. 2 is a view illustrating a plurality of display panels and a cabinet which construct the tiled display device in accordance with the present disclosure.

FIG. 2 is a view illustrating a plurality of display panels 110 and a cabinet 111 which is part of the tiled display device 150.

As shown in FIG. 2, the tiled display device 150 is formed as a plurality of cabinets 111 are tiled, and each cabinet 111 is formed as a plurality of display panels 110 are assembled.

In the present disclosure, the tiled display device 150 is not formed as only display panels 110 being tiled one-by-one, but may be fabricated as cabinets 111 being tiled together. The reason for this is as follows.

The unit cost of the display panel 110 depends on the size thereof. Also, as the display panel 110 is manufactured to have a large area, the quality of the display panel 110 may degrade. Therefore, in order to create the tiled display device 150 with minimum cost, it is economical to manufacture display panels 110 of a size capable of being manufactured with minimum cost and then tile such display panels 110.

Meanwhile, since a plurality of display panels 110 are tilled to achieve the tiled display device 150, the tiled display device 150 to which the display panels 110 are attached should be provided with coupling structures for tiling, and also the display panels 110 as attachment targets should be provided with additional coupling structures. As the coupling structures of the tiled display device 150 and the display panels 110 are coupled with each other, the display panels 110 can thus be tiled together.

Such tiling work of the display panels 110 may be performed manually by a worker. Therefore, in the case of tiling a number of display panels 110, the coupling structures of the display panels 110 and the plate 154 of the tiled display device 150 may be complicated, and a working time may be lengthened.

In other words, in the case of tiling the display panel 110 of a large size, the manufacturing cost of the display panel 110 may increase relatively to a tiling cost, and in the case of tiling the display panel 110 of a small size, the tiling cost may increase relatively to the manufacturing cost of the display panel 110. In the present disclosure, by minimizing the manufacturing cost of the display panel 110 and minimizing the tiling cost of the display panel 110, the fabrication cost of the tiled display device 150 is minimized. To this end, in the present disclosure, by manufacturing each display panel 110 to a size incurring a least manufacturing cost, assembling a plurality of manufactured display panels 110 by the unit of cabinet 111 through using an assembling apparatus of a relatively simple structure and tiling assembled cabinets 111, the fabrication cost of the tiled display device 150 could be minimized.

Figure 3A:
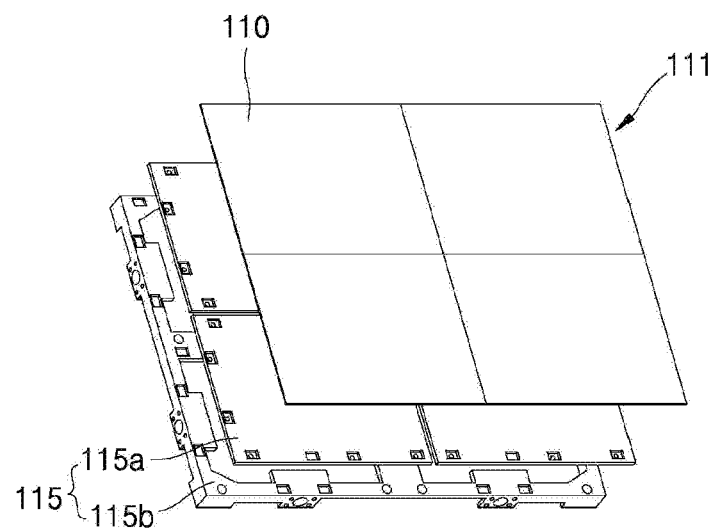
FIG. 3A is an exploded perspective view illustrating an assembling member which assembles a plurality of display panels.
Figure 3B:
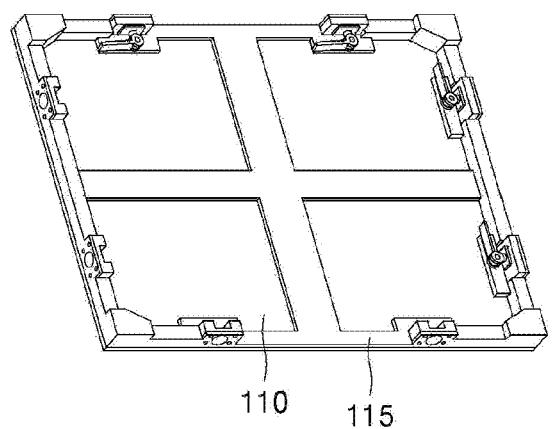
FIG. 3B is a rear view of a cabinet coupling unit in which the plurality of display panels are assembled by the assembling member.

FIG. 3A is an exploded perspective view illustrating an assembling member 115 which assembles a plurality of display panels 110, and FIG. 3B is a rear view of a cabinet coupling unit 115b in which the plurality of display panels 110 are assembled by the assembling member 115.

As shown in FIG. 3A, the assembling member 115 includes a housing 115a which receives and fixes the plurality of display panels 110 thereto and the cabinet coupling unit 115b which assembles the plurality of display panels 110 received in the housing 115a.

As shown in FIG. 3B, the plurality of display panels 110 are assembled in units of cabinets 111 (that have multiple display panels 110 attached together) by the cabinet coupling unit 115b. While it is illustrated in the drawing that the unit cabinet 111 of a 2×2 structure is formed as four display panels 110 are assembled, it is to be noted that the present disclosure is not limited thereto and the unit cabinet 111 of a n×m (n, m is positive integer) structure may be used.

Each unit cabinet 111 constructed as mentioned above or each display panel 110 can be attached to the tiled display device 150 by a tiling apparatus.

Hereinbelow, more detailed descriptions will be made for a tiling apparatus in accordance with the present disclosure. While the tiling apparatus performs a tiling task in units of cabinets or by single display panels, the following descriptions will be made for the tiling apparatus which performs a tiling task by units of single display panel, for the sake of convenience in explanation.

Figure 4:
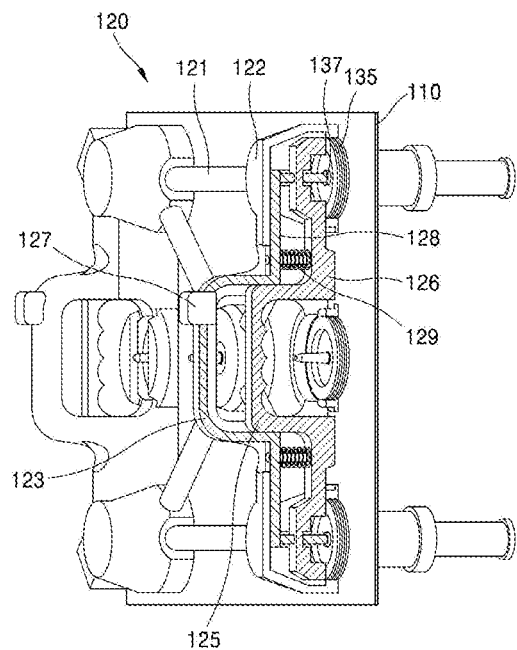
FIG. 4 is a view illustrating a tiling apparatus in accordance with the present disclosure.

FIG. 4 is a view illustrating a tiling apparatus 120 which tiles a display panel 110, in accordance with the present disclosure.

As shown in FIG. 4, in the tiling apparatus 120 in accordance with the present disclosure, in a state in which the front side of the display panel 110 is attached to the tiling apparatus 120 by a magnetic force, as a worker grasps the tiling apparatus 120, moves to the front of the plate 154 of the tiled display device 150, attaches the display panel 110 to the plate 154 and then separates the tiling apparatus 120 from the display panel 110, the display panel 110 may be tiled to the tiled display device 150.

The plate 154 may accommodate a display device of a relatively large size such as a large-sized TV or may be for a mobile case which forms a mobile electronic display board or the like. In the case where the tiled display device 150 is formed on a wall surface, the plate 154 may be a coupling plate attached onto the wall surface or may be the wall surface itself (or a portion thereof).

The tiling apparatus 120 is constructed by a frame 121 which forms a framework, a first magnet 135 which is disposed at each of the four corners of the frame 121 to attach and fix (mount) the display panel 110, a second magnet 137 which detaches the display panel 110 attached to the plate 154 by applying a repulsive force to the display panel 110 or the plate 154 of the tiled display device 150, a handle 123 which is formed at each side of the frame 121 and is grasped by a worker to perform a tiling work, a first driving member 125 which is disposed inwardly of the handle 123 and moves, when driven by the worker, the first magnet 135 to separate the tiling apparatus 120 from the display panel 110 attached to the plate 154 of the tiled display device 150, and a second driving member 127 which is disposed on the handle 123 at one end of the handle 123 and moves, when driven by the worker, the second magnet 137 to separate the display panel 110 attached to the plate 154 of the tiled display device 150, from the plate 154, and thereby detach the tiled display panel 110 from the tiled display device 150.

The frame 121 is disposed to extend in the transverse direction, the longitudinal direction and the diagonal direction about a central base, and is coupled with a pair of support bars 122 at both sides thereof. The support bars 122 are formed to extend in the longitudinal direction at the left and right regions of the frame 121, and the middle portion of each support bar 122 is projected outward and is coupled with the handle 123.

A first pressure bar 126 is disposed at the inner end of each support bar 122. The first pressure bar 126 extends in the longitudinal direction in the same manner as the support bar 122 at the inner end of the support bar 122, and the middle portion of the first pressure bar 126 is projected and is coupled with the first driving member 125. Each of the upper and lower ends of the first pressure bar 126 is coupled with the first magnet 135.

The first driving member 125 may be disposed to be spaced apart by a predetermined distance from the inner end of the handle 123 such that the worker's fingers can be engaged with the first driving member 125 when the worker grasps the handle 123. As shown in the drawing, a plurality of grooves may be formed on the first driving member 125 to allow the worker's fingers to be engaged therein, thereby preventing the worker's fingers from slipping when actuating the first driving member 125. However, the first driving member 125 is not limited to the illustrated shape and may be constructed to have various shapes.

The first pressure bar 126 transfers the motion of the first driving member 125 to the first magnet 135. That is to say, if the worker pulls the fingers while grasping the handle 123, the first driving member 125 is moved outward toward the handle 123 (i.e. is moved away from the display panel 110), and the first pressure bar 126 coupled with the first driving member 125 is also moved outward (in a direction facing away from the display panel 110). As the first magnet 135 coupled to each of both ends of the first pressure bar 126 is also moved away from the display panel 110 according to the movement of the first pressure bar 126, the first magnet 135 is separated from the display panel 110.

A spring 129 may be disposed between the support bar 122 and the first pressure bar 126, and may return the first pressure bar 126 to its original position after the first driving member 125 is driven.

A second pressure bar 128 is disposed inward of the support bar 122. The second pressure bar 128 extends along the longitudinal direction at each of both sides of the support frame 121, and the middle portion thereof is projected. The outer surface of the projected middle portion contacts with the inner surface of the handle 123, and the handle 123 and the middle portion of the second pressure bar 128 form a coupled bar as they are in contact with each other. Accordingly, when the worker grasps the handle 123, the handle 123 and the middle portion of the second pressure bar 128 which are in contact with each other are grasped together. Meanwhile, a groove may be formed on the inner surface of the handle 123, and the handle 123 may accommodate the middle portion of the second pressure bar 128.

The second driving member 127 is formed at one end of the projected middle portion of the second pressure bar 128. The second driving member 127 is connected with the second magnet 137 through the second pressure bar 128. The second driving member 127 may be formed to be projected outward from the handle 123 by a predetermined dimension so as to be driven by the worker's thumb when the worker grasps the handle 123.

The second pressure bar 128 transfers the motion of the second driving member 127 to the second magnet 137. In other words, if the worker drives the second driving member 127 by stretching the thumb and pushing the second driving member 127 inward while gasping the handle 123, the second driving member 127 is moved inward (that is, in a direction facing the display panel 110), and the second pressure bar 128 coupled with the second driving member 127 is also moved in the direction facing the display panel 110. As the second pressure bar 128 is moved, the second magnet 137 coupled to each of both ends of the second pressure bar 128 is also moved toward the surface of the display panel 110.

The first magnet 135 and the second magnet 137 are disposed at each of the four corners of the tiling apparatus 120, are respectively coupled to the first pressure bar 126 and the second pressure bar 128, and are moved as the first driving member 125 and the second driving member 127 are driven.

The first magnet 135 as a magnet for attaching the display panel 110 to the tiling apparatus 120 may be constructed into a circular ring shape which has a predetermined width and diameter. However, it is to be noted that the first magnet 135 is not limited to such a shape and may be constructed into various shapes such as a quadrangular shape.

Since the first magnet 135 is moved while the display panel 110 is attached thereto, the intensity or magnitude of the magnetic force of the first magnet 135 may be determined or adjusted depending on the size and weight of the display panel 110 to be tiled.

The second magnet 137 as a magnet which is mainly used to detach the display panel 110 attached to the tiling apparatus 120 is disposed at each of the four corners of the tiling apparatus 120. The second magnet 137 may be constructed into a circular shape having a predetermined diameter or a polygonal shape having a predetermined size. However, it is to be noted that the second magnet 137 is not limited to such a shape and may be constructed into various shapes such as a ring shape. The second magnet 137 may be disposed in the ring-shaped first magnet 135.

Since the second magnet 137 is moved not by attaching the display panel 110 thereto and simply detaches the display panel 110 attached to the tiled display device 150, the magnetic force of the second magnet 137 may be smaller than the magnetic force of the first magnet 135. The second magnet 137 may be constructed into a circular ring shape of a diameter smaller than the first magnet 135, and may be disposed inside the first magnet 135.

The first magnet 135 and the second magnet 137 are driven by actuating the first driving member 125 and the second driving member 127, such that the display panel 110 can be attached to the tiling apparatus 120 or can detach the display panel 110 from the tiled display device 150.

Figure 5A:
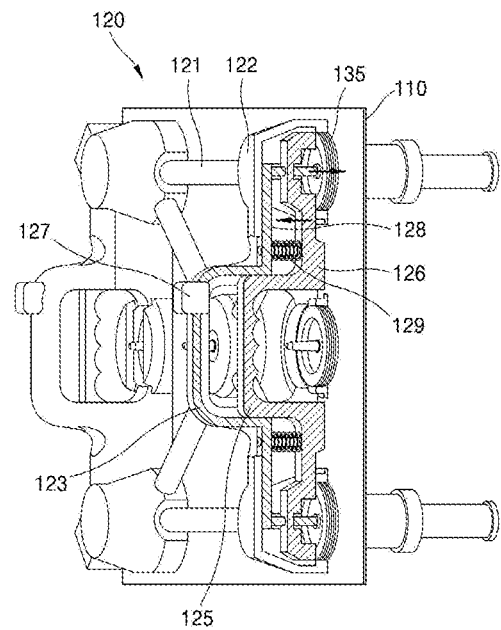
FIGS. 5A to 5C are views illustrating the driving of the tiling apparatus in accordance with the present disclosure.
Figure 5B:
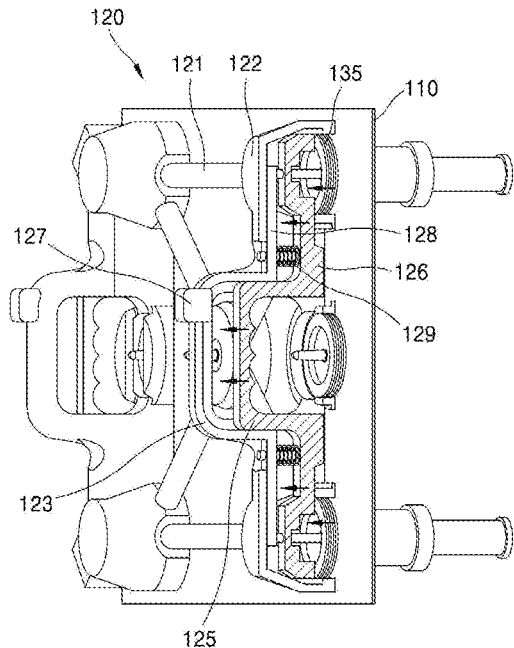
Figure 5C:
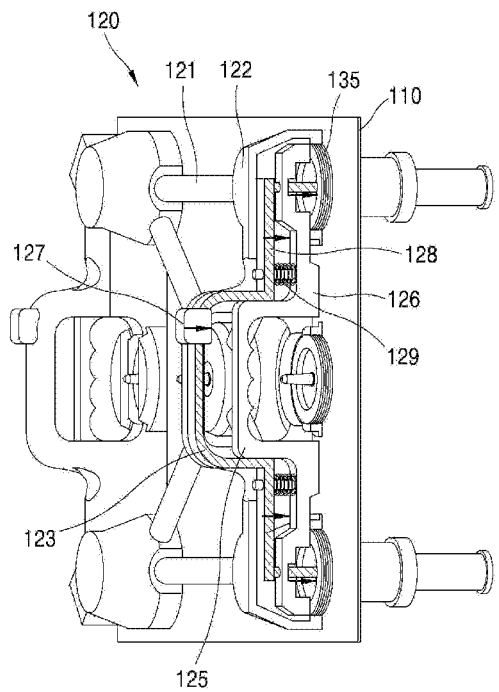

FIGS. 5A to 5C are views illustrating that the first magnet 135 and the second magnet 137 are driven as the first driving member 125 and the second driving member 127 are driven.

As shown in FIG. 5A, because the first driving member 125 and the second driving member 127 are not driven in a state in which the display panel 110 is attached to the tiling apparatus 120, the display panel 110 is temporarily fixed to the tiling apparatus 120 by being attached via the first magnet 135. In this state, the worker grasps the handle 123 and moves the tiling apparatus 120 to which the display panel 110 is attached, to the front of the tiled display device 150.

As shown in FIG. 5B, if the worker drives the first driving member 125 in a state in which the display panel 110 is attached to the tiled display device 150, the first driving member 125 is moved outward (in the direction facing away from the display panel 110), and at the same time, the first pressure bar 126 which is connected with the first driving member 125 is also moved in the direction facing away from the display panel 110. In addition, as the first magnet 135 coupled with the first pressure bar 126 is moved in the direction facing away from the display panel 110, the first magnet 135 is separated from the display panel 110.

Namely, since the tiling apparatus 120 is separated from the display panel 110 in the state in which the display panel 110 is attached to the tiled display device 150, the display panel 110 attached to the tiling apparatus 120 is tiled to the tiled display device 150 according to the driving of the first driving member 125.

As the worker attaches another display panel 110 to the separated tiling apparatus 120 and then repeats the above-described process, all display panels 110 may be tiled to the tiled display device 150.

As shown in FIG. 5C, if the second driving member 127 is driven in a state in which the tiling apparatus 120 is placed on the front side of the display panel 110 tiled to the tiled display device 150 and attaches the front side of the display panel 110 thereto by the first magnet 135, the second driving member 127 is moved inward (in a direction facing the display panel 110), and at the same time, the second pressure bar 128 which is coupled with the second driving member 127 is also moved in the direction facing the display panel 110.

In addition, the second magnet 137 which is coupled with the second pressure bar 128 is moved toward the display panel 110. As the second magnet 137 approaches the display panel 110, by the attractive force between the second magnet 137 and the magnet disposed in the display panel 110 or the repulsive force between the second magnet 137 and the magnet disposed in the tiled display device 150, the magnetic force of the tiling apparatus 120 with respect to the display panel 110 exceeds the magnetic force of the tiled display device 150. In this state, as the tiling apparatus 120 is moved in the direction facing away from the tiled display device 150, the display panel 110 is detached from the tiled display device 150, while it is attached to the tiling apparatus 120.

In this way, in the tiling apparatus 120 in accordance with the present disclosure, since the worker may tile the display panel 110 from the front of the tiled display device 150 in a state in which the display panel 110 is attached to the tiling apparatus 120 by the first magnet 135, it is possible to easily tile the display panel 110.

Further, in the present disclosure, since the display panel 110 tiled to the tiled display device 150 is separated by the magnetic force of the second magnet 137, when compared to a mechanical separation method in which a display panel is separated with special tools or equipment, the display panel 110 may be easily separated.

Moreover, in the present disclosure, because the first magnet 135 and the second magnet 137 are driven by actuating the first driving member 125 and the second driving member 127 connected to the handle 123, attachment and detachment of the display panel 110 to and from the tiled display device 150 may be easily implemented.

The display panel 110 may be tiled to the tiled display device 150 by easily moving the display panel 110 under the state in which the display panel 110 is attached to the tiling apparatus 120 by the magnetic force of a magnet. That is, the display panel 110 may be tiled to the tiled display device 150 by a magnetic force. Moreover, since the display panel 110 is provided with guides, the display panel 110 may be positioned at a predetermined coordinate of the tiled display device 150 when tiling the display panel 110. Accordingly, it is possible to prevent a failure from occurring due to a misalignment. The guides not only perform the function of aligning the display panel 110 and the tiled display device 150 during tiling, but also perform the function of attaching the display panel 110 to the tiled display device 150.

Hereinafter, detailed descriptions will be made with reference to the attached drawings for a display panel to be tiled by the tiling apparatus 120 according to the present disclosure and a tiled display device.

Figure 6:
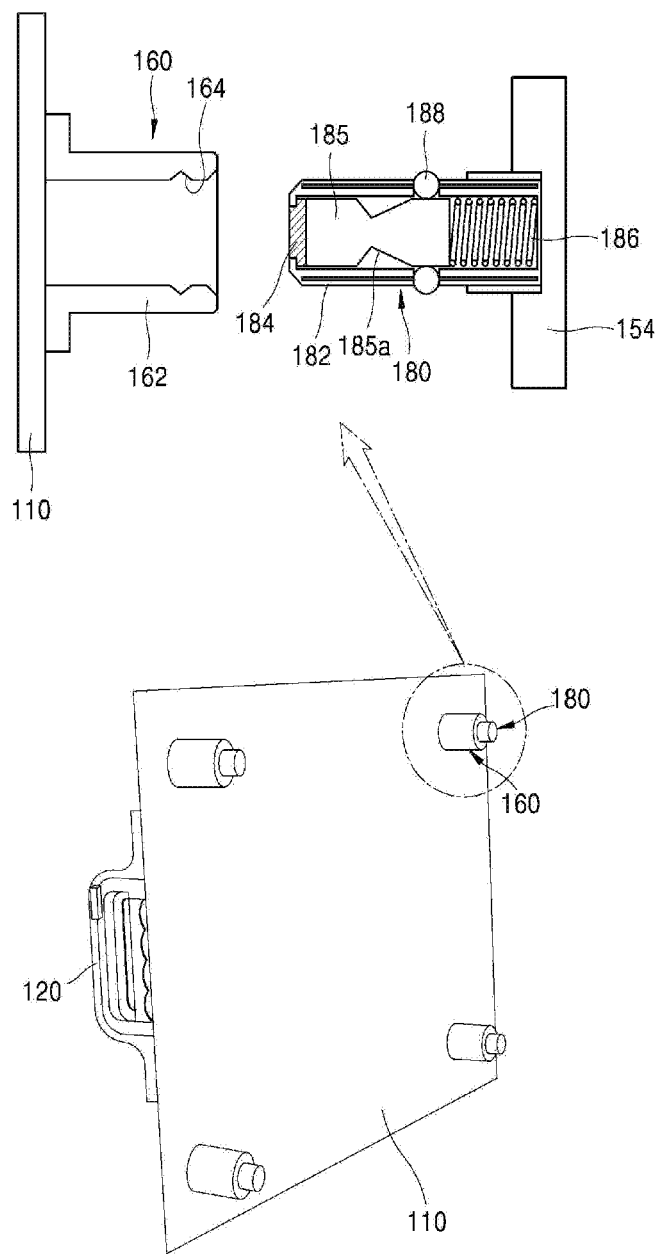
FIG. 6 is a view illustrating the structure of a tiled display device in accordance with a first embodiment of the present disclosure.

FIG. 6 is a view illustrating the structure of a tiled display device 150 in accordance with a first embodiment of the present disclosure. Since the tiled display device 150 is the same as that shown in FIG. 1, only a coupling structure in which the display panel 110 and the plate 154 of the tiled display device 150 are coupled with each other is specifically shown in the drawing.

As shown in FIG. 6, a first coupling unit 160 is disposed around each corners on the rear side of the display panel 110, and a second coupling unit 180 corresponding to the first coupling unit 160 is disposed on the front side of the plate 154 of the tiled display device 150. In a state in which the tiling apparatus 120 is disposed on the front side of the display panel 110 and attached to the display panel 110, the display panel 110 is assembled to the plate 154.

In order to show the coupling relationship between the first coupling unit 160 and the second coupling unit 180, the plate 154 is not illustrated in the perspective view of the drawing, and the plate 154 to which the second coupling unit 180 is fixed is illustrated in only the partially exploded cross-sectional view of the drawing. The first coupling unit 160 and the second coupling unit 180 not only tile the display panel 110 to the plate 154 of the tiled display device 150 by being coupled with each other, but also align the display panel 110 with the plate 154. That is to say, in the present disclosure, the coupling the first coupling unit 160 and the second coupling unit 180 may perform a function as alignment means to align them each other. Therefore, in the present disclosure, it is possible to tile the display panel 110 at a predetermined position on the plate 154 without using an additional alignment apparatus.

The first coupling unit 160 may include a circular cylindrical body 162 and a coupling groove 164 which is formed along the inner surface of the body 162.

The second coupling unit 180 may include a hollow cylindrical guide 182 which is inserted into the body 162 of the first coupling unit 160, a movable member 185 which is inserted into the guide 182 and is moved therein, a first tiling magnet 184 which is provided to the distal end of the movable member 185 and attaches the display panel 110, an elastic member 186 such as a spring which is disposed between the plate 154 and the movable member 185, and coupling members 188 which are disposed along the circumference of the guide 182. The diameter of the cylindrical inner space of the body 162 of the first coupling unit 160 is set to be almost the same as the outer diameter of the guide 182 of the second coupling unit 180. Accordingly, when coupling the first coupling unit 160 and the second coupling unit 180, the display panel 110 may be tiled at the predetermined position with minimized misalignment.

Meanwhile, the body 162 of the first coupling unit 160 is not limited to the circular cylindrical shape, but may be applied to various shapes such as a polygonal cylindrical shape. The guide 182 of the second coupling unit 180 inserted into the body 162 may also be applied to various shapes such as a polygonal cylindrical shape, similarly to the body 162.

The coupling member 188 of the second coupling unit 180 is coupled into the coupling groove 164 of the first coupling unit 160, and serves as a stopper which prevents the first coupling unit 160 and the second coupling unit 180 coupled with each other, from being decoupled from each other.

Each of the coupling members 188 is disposed in the through hole formed in the guide 182 to be moved inward and outward through the through hole. The coupling member 188 may be beads which are disposed along the circumference of the guide 182.

The movable member 185 of the second coupling unit 180 is constructed in a piston shape, is inserted into the guide 182, and is formed with a receiving groove 185a along the circumference of the middle portion thereof. The receiving groove 185a corresponds to the coupling member 188, and may be formed continuously along the circumference or may be grooves of a predetermined size which are formed at positions corresponding to the coupling member 188.

The movable member 185 is movably disposed in the guide 182, and is returned to a preset position by the elasticity of the elastic member 186. The first tiling magnet 184 is provided to the distal end of the movable member 185, and moves leftward and rightward together with the movable member 185. The first tiling magnet 184 may be formed separately from the movable member 185 and be attached to the distal end of the movable member 185. Alternatively, the first tiling magnet 184 may be formed integrally with the movable member 185, and the distal end region of the movable member 185 may be formed as a magnet.

The movable member 185 is moved in the guide 182 by the magnetic force of the tiling apparatus 120 and the elasticity of the elastic member 186. Such movement of the movable member 185 causes the receiving groove 185a to be moved, and the coupling member 188 is moved inward and outward through the guide 182 by the movement of the receiving groove 185a. The thickness of the coupling member 188 is greater than the depth of the through hole formed through the guide 182, and due to this fact, the coupling member 188 may be positioned in the receiving groove 185a or protrude out of the through hole of the guide 182 depending on the position of the movable member 185.

In the tiled display device 150 structured as mentioned above, after the display panel 110 is attached to the plate 154 by the first tiling magnet 184, the display panel 110 may be tiled by the magnetic force of the first tiling magnet 184 and the coupling force of the coupling member 188. Further, the display panel 110 may be separated from the tiled display device 150 by the first tiling magnet 184.

FIGS. 7a to 7e are views illustrating a method for tiling the display panel 110 to the plate 154 of the tiled display device 150 by the tiling apparatus 120 in accordance with the first embodiment.

Figure 7A:
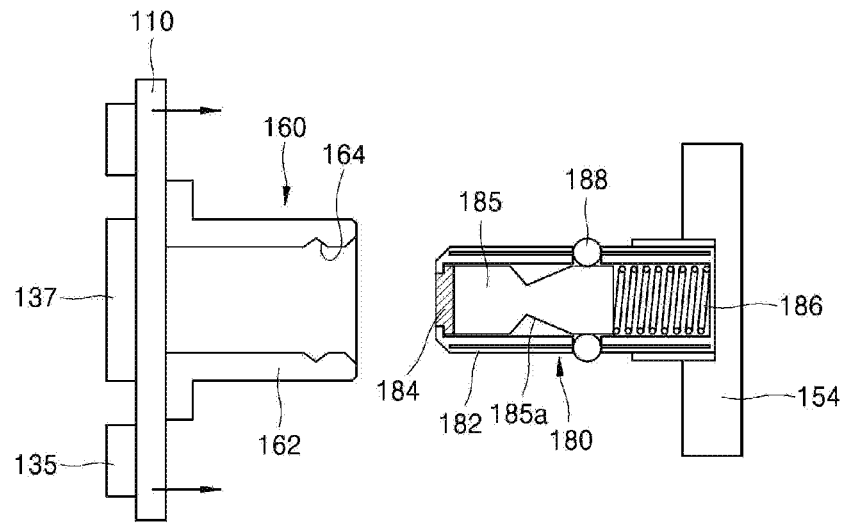
FIGS. 7A to 7E are views illustrating a method for tiling a display panel by the tiling apparatus in accordance with the first embodiment.

First, as shown in FIG. 7A, in a state in which the front side of the display panel 110 is attached to the tiling apparatus 120 by the first magnet 135 of the tiling apparatus 120 in accordance with the present disclosure, the worker places the display panel 110 in front of the plate 154 of the tiled display device 150.

Figure 7B:
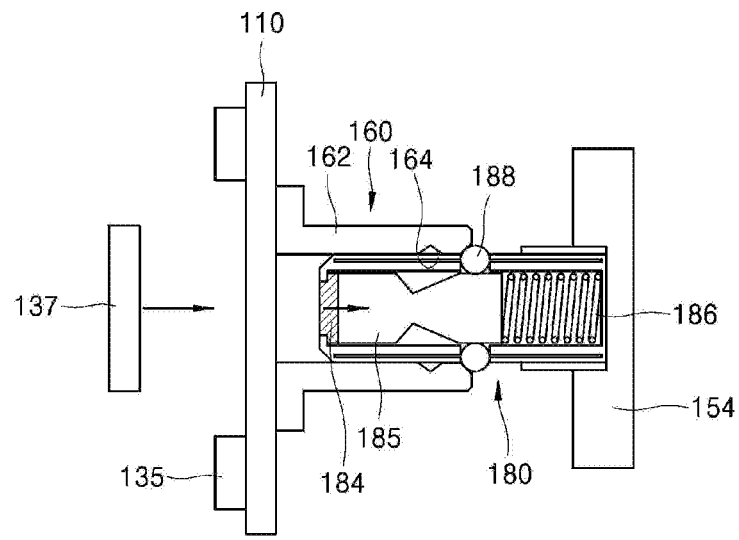

In this state, as the display panel 110 fixed to the tiling apparatus 120 is moved toward the plate 154, as shown in FIG. 7B, the first coupling unit 160 is moved along the second coupling unit 180, and the second coupling unit 180 is inserted into the first coupling unit 160. The movement of the first coupling unit 160 is stopped as the coupling member 188 which protrudes outward out of the guide 182 by the movable member 185 is brought into contact with the end of the body 162 of the first coupling unit 160. In other words, as the first coupling unit 160 and the second coupling unit 180 are coupled only partially with each other, the first tiling magnet 184 and the movable member 185 are separated from the display panel 110 by a preselected distance.

Figure 7C:
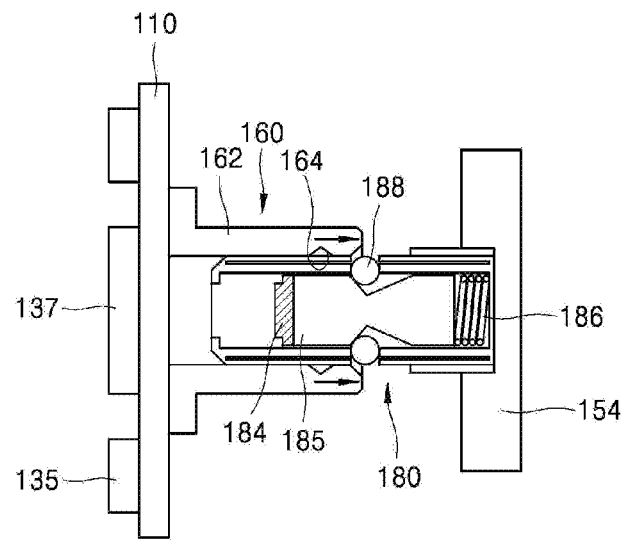

Thereafter, as the second magnet 137 approaches the display panel 110 by actuating the second driving member 127 of the tiling apparatus 120, since the region of the second magnet 137 facing the display panel 110 and the region of the first tiling magnet 184 facing the display panel 110 have the same polarity, as shown in FIG. 7C, the first tiling magnet 184 and the movable member 185 are moved in a direction opposite to the elasticity of the elastic member 186, that is, toward the plate 154, and thereby, the receiving groove 185a of the movable member 185 is placed at the corresponding position to the coupling member 188.

Figure 7D:
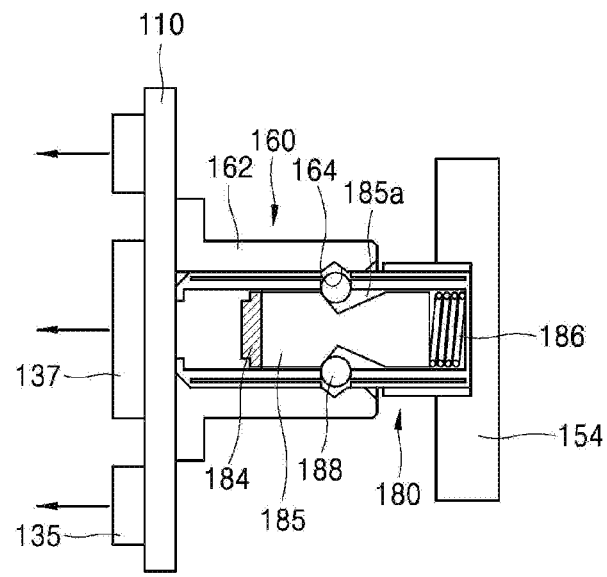

Then, as the worker further pushes the tiling apparatus 120 toward the plate 154 and thereby moves the first coupling unit 160 toward the plate 154, as shown in FIG. 7D, the coupling member 188 is received in the receiving groove 185a of the movable member 185, and the coupling groove 164 of the first coupling unit 160 is placed at the position where the coupling member 188 is disposed.

Subsequently, as the tiling apparatus 120 is moved leftward by a certain distance from the plate 154 in a state in which the worker drives the first driving member 125 of the tiling apparatus 120 and thus the first magnet 135 is separated from the display panel 110, the second magnet 137 which provides a repulsive force to the first tiling magnet 184 is also removed from the display panel 110, and the first tiling magnet 184 and the movable member 185 are moved toward the display panel 110 by the elasticity of the elastic member 186.

Figure 7E:
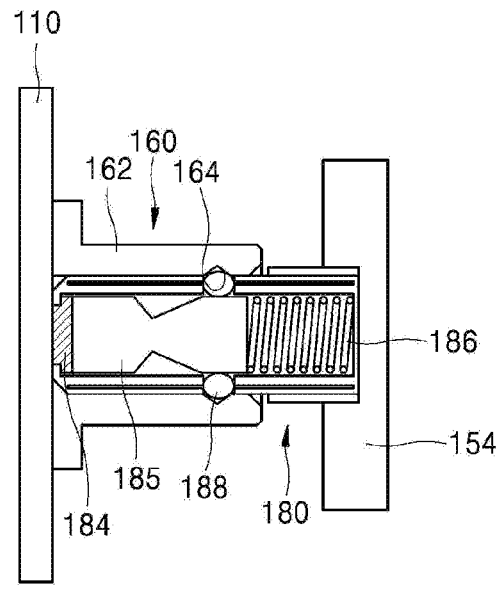

Thus, as shown in FIG. 7E, the first tiling magnet 184 is brought into contact with the surface of the display panel 110. Since the display panel 110 is received in a back cover which is made of a metal, the first tiling magnet 184 applies an attractive force to the back cover on the rear side of the display panel 110 and thereby the display panel 110 is fixed, and the coupling member 188 positioned in the receiving groove 185a protrudes out of the guide 182 and is coupled into the coupling groove 164 of the first coupling unit 160. In the case where display panels 110 are tiled after being assembled by the unit of cabinet, by applying an attractive force to a cabinet coupling unit which is made of a metal or contains a metal, the first tiling magnet 184 may attach the display panels 110.

In this way, in the tiled display device 150 in accordance with the present embodiment, since the plate 154 of the tiled display device 150 is provided with a magnet and the coupling member 188 to tile the display panel 110, the display panel 110 may be tiled as the worker simply attaches the display panel 110 fixed to the tiling apparatus 120, easily to the plate 154 in front of the tiled display device 150, without a mechanical manipulation such as assembling of screws for tiling. Accordingly, the tiling of the display panel 110 may be quickly and easily performed.

In the present disclosure, the display panel 110 tiled to the tiled display device 150 may be detached by the tiling apparatus 120. A detachment method in the tiled display device 150 in accordance with the first embodiment will be described below with reference to FIGS. 8a to 8c.

Figure 8A:
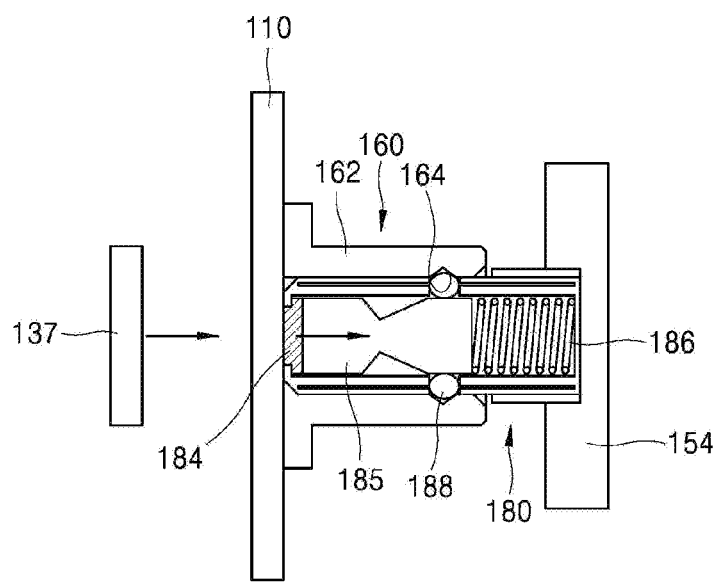
FIGS. 8A to 8C are views illustrating a method for detaching the display panel from the tiled display device by the tiling apparatus in accordance with the first embodiment of the present disclosure.

As shown in FIG. 8A, as the worker is positioned in front of the tiled display device 150 to which the display panel 110 is tiled through coupling of the first coupling unit 160 and the second coupling unit 180 and, in a state in which the tiling apparatus 120 is attached to the display panel 110, moves the second magnet 137 toward the display panel 110 by actuating the second driving member 127 of the tiling apparatus 120, the movable member 185 is moved toward the plate 154 due to the repulsive force between the second magnet 137 and the first tiling magnet 184 disposed at the distal end of the movable member 185 of the second coupling unit 180.

Figure 8B:
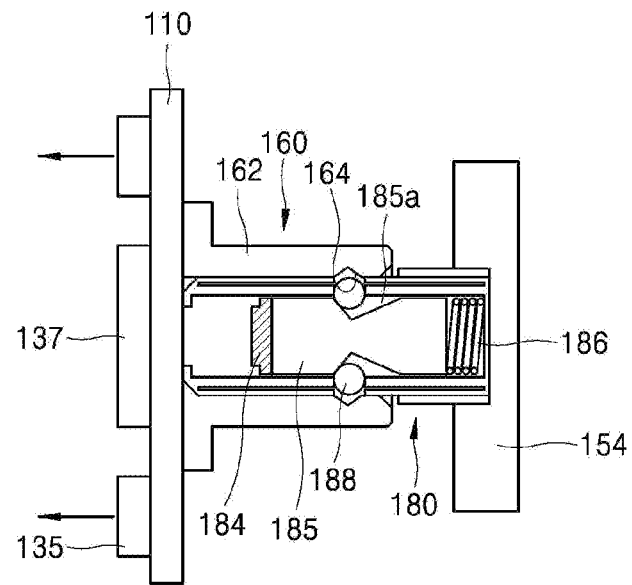

As shown in FIG. 8B, as the first tiling magnet 184 is moved, the attachment force of the display panel 110 by the magnetic force of the first tiling magnet 184 is removed. Also, as the movable member 185 is moved, the receiving groove 185a of the movable member 185 is positioned at the corresponding position to the coupling member 188 and thus the coupling member 188 is received in the receiving groove 185a, and accordingly, the coupling of the coupling member 188 and the coupling groove 164 of the first coupling unit 160 is released.

Figure 8C:
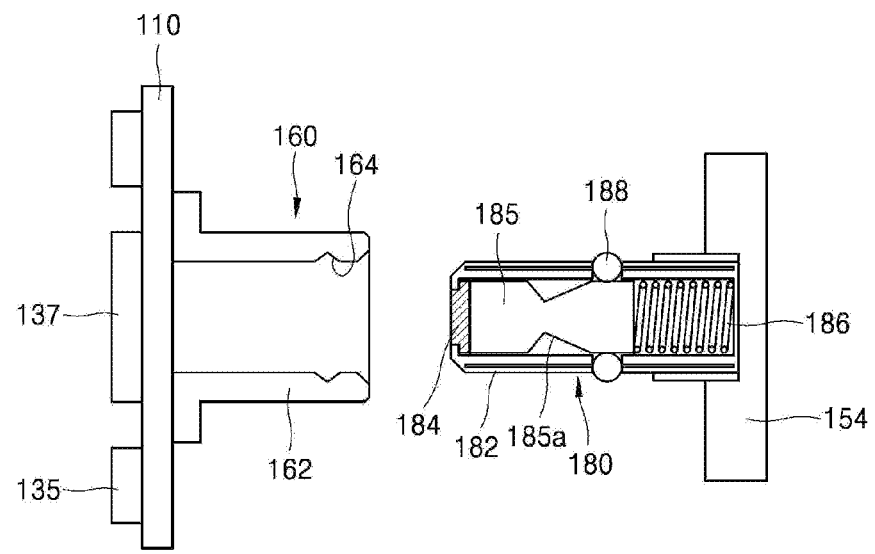

Thereafter, in the state in which the coupling of the coupling member 188 and the coupling groove 164 of the first coupling unit 160 is released, as the tiling apparatus 120 is moved in the direction facing away from the plate 154, as shown in FIG. 8C, the display panel 110 may be detached from the tiled display device 150.

In this way, in the tiled display device 150 in accordance with the present embodiment, since the display panel 110 may be detached, without using an additional mechanism, by simply attaching the tiling apparatus 120 to the display panel 110 of the tiled display device 150 and then actuating the second driving member 127, it is possible to quickly and easily disassemble the tiled display device 150.

Figure 9:
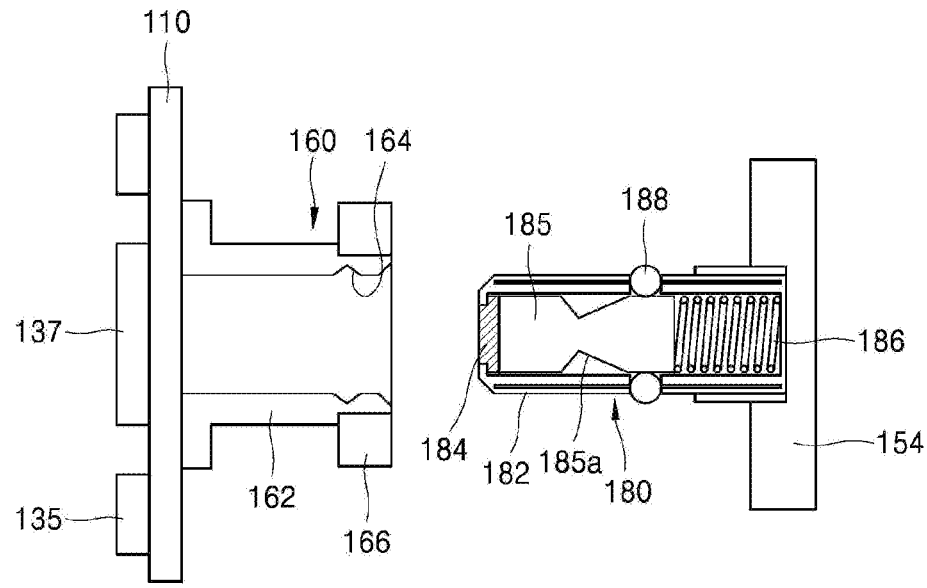
FIG. 9 is a view illustrating another example of the tiled display device in accordance with the first embodiment of the present disclosure.

FIG. 9 is a view illustrating another example of the tiled display device in accordance with the first embodiment of the present disclosure. The difference between the structure of the tiled display device 150 shown in FIG. 9 and the structure of the tiled display device 150 shown in FIG. 6 is a second tiling magnet 166 which is disposed on the first coupling unit 160. Therefore, descriptions for the other components will be omitted herein, and only the second tiling magnet 166 will be described below.

As shown in FIG. 9, the end region of the body 162 of the first coupling unit 160 is provided with the second tiling magnet 166. The second tiling magnet 166 is to cooperate with the first tiling magnet 184 disposed at the distal end of the movable member 185 of the second coupling unit 180 and thereby move the movable member 185. Namely, in the structure shown in FIG. 6, the first tiling magnet 184 and the movable member 185 of the second coupling unit 180 are moved by the repulsive force of the second magnet 137 of the tiling apparatus 120, whereas, in the structure shown in FIG. 9, the first tiling magnet 184 and the movable member 185 are moved by the second tiling magnet 166.

FIGS. 10a to 10e are views illustrating methods for attaching and detaching the display panel 110 to and from the tiled display device 150 of the structure shown in FIG. 9.

Figure 10A:
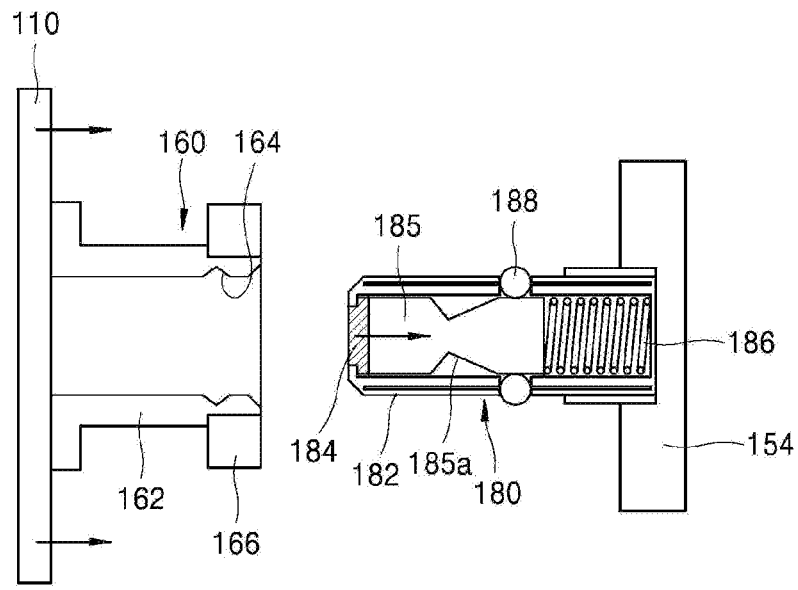
FIGS. 10A to 10E are views illustrating methods for attaching and detaching a display panel to and from the tiled display device of the structure shown in FIG. 9.

First, as shown in FIG. 10A, in a state in which the display panel 110 is attached to the tiling apparatus 120 by the first magnet 135 of the tiling apparatus 120, as the display panel 110 is pushed toward the plate 154 and thus the second coupling unit 180 is inserted into the first coupling unit 160, a repulsive force is applied between the first tiling magnet 184 and the second tiling magnet 166 which have opposite polarities in the regions thereof facing each other.

Figure 10B:
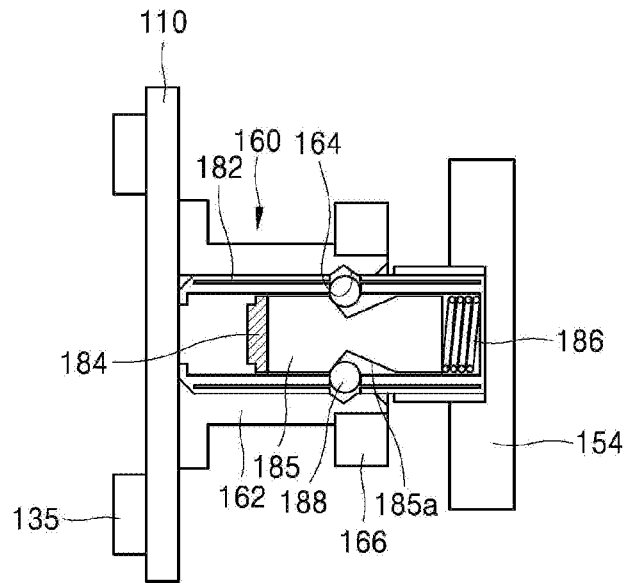
Figure 10C:
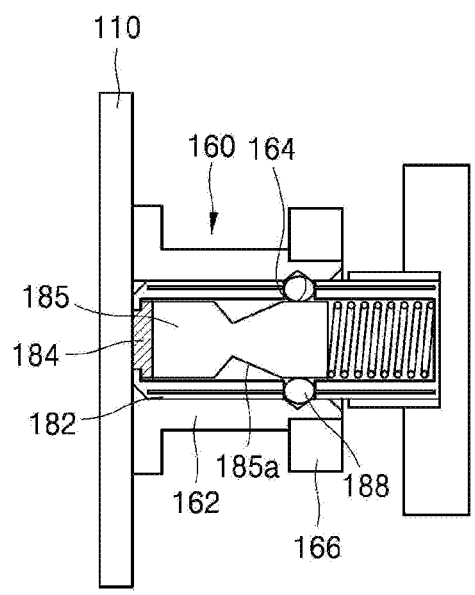

Thus, as the first coupling unit 160 is pushed toward the plate 154, the movable member 185 is moved toward the plate 154, and, as shown in FIG. 10B, the receiving groove 185a of the movable member 185 is aligned with the coupling member 188. Although the coupling member 188 contacts with the end of the body 162 of the first coupling unit 160, since the coupling member 188 is received in the receiving groove 185a, the first coupling unit 160 is continuously moved and the coupling member 188 is coupled into the coupling groove 164 of the first coupling unit 160.

In succession, as the first coupling unit 160 is pushed toward the plate 154, the first coupling unit 160 and the second tiling magnet 166 on the end of the first coupling unit 160 are moved toward the plate 154, but the first tiling magnet 184 and the movable member 185 are not moved by the elasticity of the elastic member 186. Accordingly, the second tiling magnet 166 is moved and the movable member 185 is stopped. As the second tiling magnet 166 passes the first tiling magnet 184, since the repulsive force between the first tiling magnet 184 and the second tiling magnet 166 is removed (or a repulsive force is applied in opposite directions), as shown in FIG. 10O, the movable member 185 is moved toward the display panel 110 by the elasticity of the elastic member 186, and the display panel 110 is attached to the first tiling magnet 184 and is thus tiled to the plate 154.

Figure 10D:
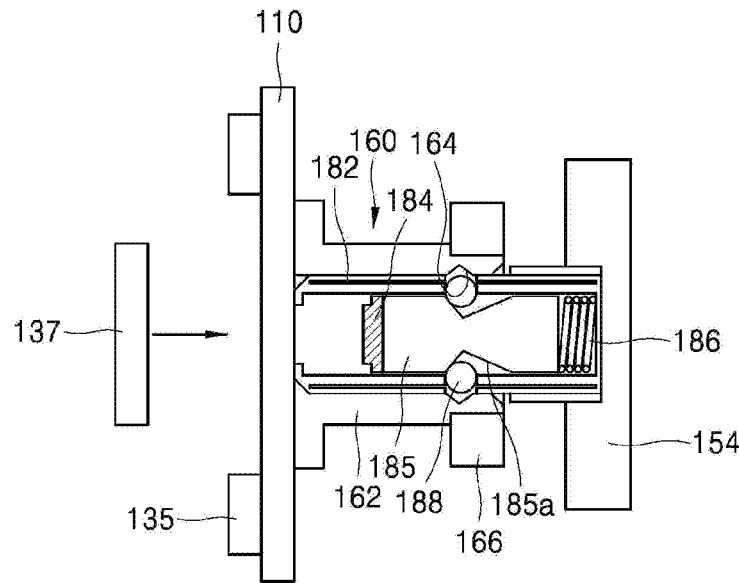

When detaching the display panel 110 from the plate 154, as shown in FIG. 10D, in a state in which the display panel 110 is attached to the tiling apparatus 120 by the first magnet 135, as the second magnet 137 is moved toward the display panel 110 by actuating the second driving member 127, the first tiling magnet 184 is separated from the display panel 110 and is moved toward the plate 154 by the repulsive force between the second magnet 137 and the first tiling magnet 184 which have the same polarity on the surfaces thereof facing each other. As the receiving groove 185a of the movable member 185 is aligned with the coupling member 188, the coupling member 188 is received in the receiving groove 185a, and the coupling of the coupling member 188 and the coupling groove 164 is released.

Figure 10E:
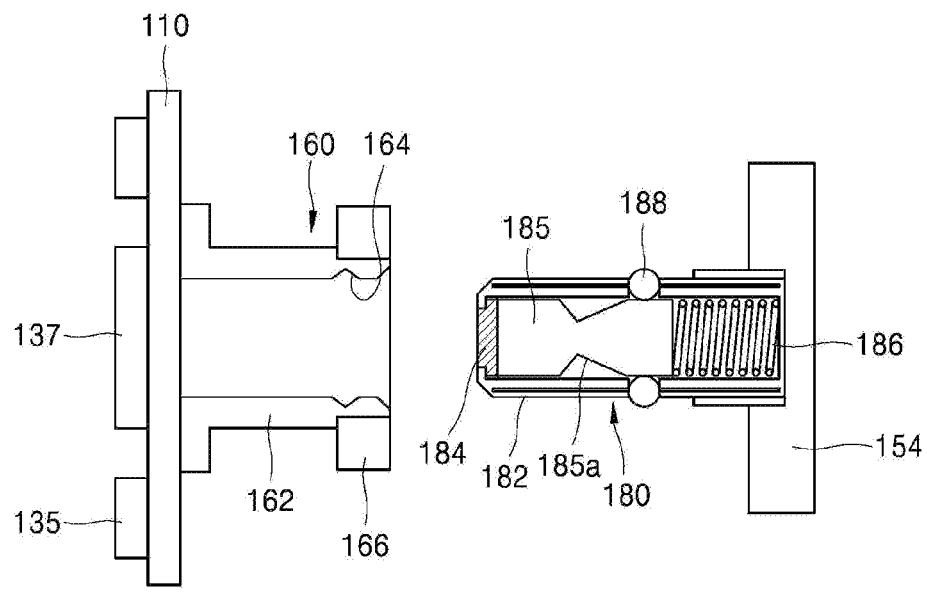

In this way, in the state in which the first tiling magnet 184 is separated from the display panel 110 and the coupling of the coupling member 188 and the coupling groove 164 is released, as shown in FIG. 10E, as the tiling apparatus 120 to which the display panel 110 is attached is moved in the direction facing away from the plate 154, the display panel 110 is completely detached from the tiled display device 150.

Figure 11:
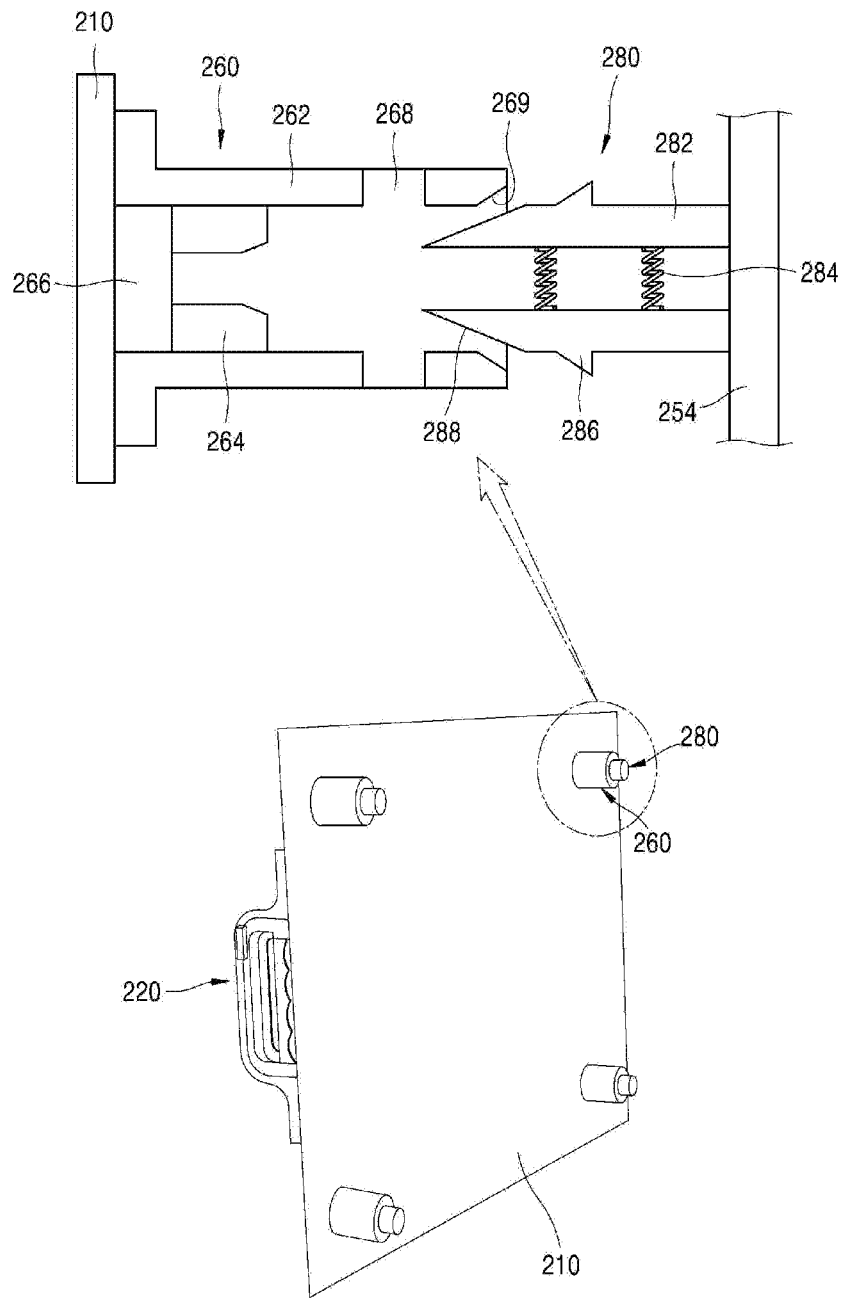
FIG. 11 is a view illustrating a tiled display device in accordance with a second embodiment of the present disclosure.

FIG. 11 is a view illustrating a tiled display device in accordance with a second embodiment of the present disclosure. Hereinbelow, descriptions for the same structure as that of the first embodiment will be omitted or be briefly made, and detailed descriptions will be made for a different structure. Since the schematic structure of the tiled display device is the same as that shown in FIG. 1, a coupling structure in which a display panel 210 and a plate 254 of the tiled display device are coupled with each other is specifically shown in the drawing.

As shown in FIG. 11, a first coupling unit 260 is disposed around each corners on the rear side of the display panel 210, and a second coupling unit 280 corresponding to the first coupling unit 260 is disposed on the front side of the plate 254 of the tiled display device.

The first coupling unit 260 and the second coupling unit 280 not only tile the display panel 210 to the plate 254 of the tiled display device by being coupled with each other, but also align the display panel 210 to be tiled, with the plate 254.

The first coupling unit 260 is constructed by a circular cylindrical body 262, a movable bar 264 which is disposed along the circumferential inner surface of the body 262, a tiling magnet 266 which is disposed inside the body 262, a coupling portion 268 which is formed in the body 262, and an inclined portion 269 which is formed at the end of the body 262 to be inclined by a particular angle. While it is illustrated in FIG. 11 that the coupling portion 268 is formed to pass through the wall of the body 262, it is to be noted that the embodiment is not limited thereto. For example, the coupling portion 268 may have a concave shape which is formed on only the inner surface of the body 262.

While it is illustrated in the drawing that the body 262 is constructed into the circular cylindrical shape, it is to be noted that the embodiment is not limited to such a shape and various shapes such as a polygonal cylindrical shape like a rectangular parallelepiped may be possible.

The second coupling unit 280 is constructed by a pair of coupling bars 282 which are arranged parallel to each other and are inserted into the body 262 of the first coupling unit 260, springs 284 which are disposed between the pair of coupling bars 282 and retain the spacing of the coupling bars 282, coupling protrusions 286 which are formed on the pair of coupling bars 282, respectively, and distal end portions 288 which are formed at the distal ends of the pair of coupling bars 282 and are inclined by a particular angle.

The movable bar 264 and the tiling magnet 266 of the first coupling unit 260 are movably disposed in the body 262. In particular, if the tiling magnet 266 is moved by the second magnet 137 of the tiling apparatus 120, the movable bar 264 is also moved and detaches the display panel 210 from the tiled display device. Detailed descriptions for this will be made later.

When tiling the display panel 210, the coupling bars 282 of the second coupling unit 280 are inserted into the movable bar 264. The movable bar 264 may be formed into a circular cylindrical shape similarly to the body 262, or may be constructed into two parallel bar shapes similarly to the coupling bars 282.

The coupling protrusions 286 of the second coupling unit 280 are inserted and coupled into the coupling portion 268 of the first coupling unit 260. The coupling protrusions 286 may be constructed by inclined protrusions such as triangular shapes and may be hooked into the coupling portion 268.

FIGS. 12a to 12d are views illustrating methods for tiling and de-tiling a display panel to and from the tiled display device by the tiling apparatus 120 in accordance with the second embodiment of the present disclosure.

Figure 12A:
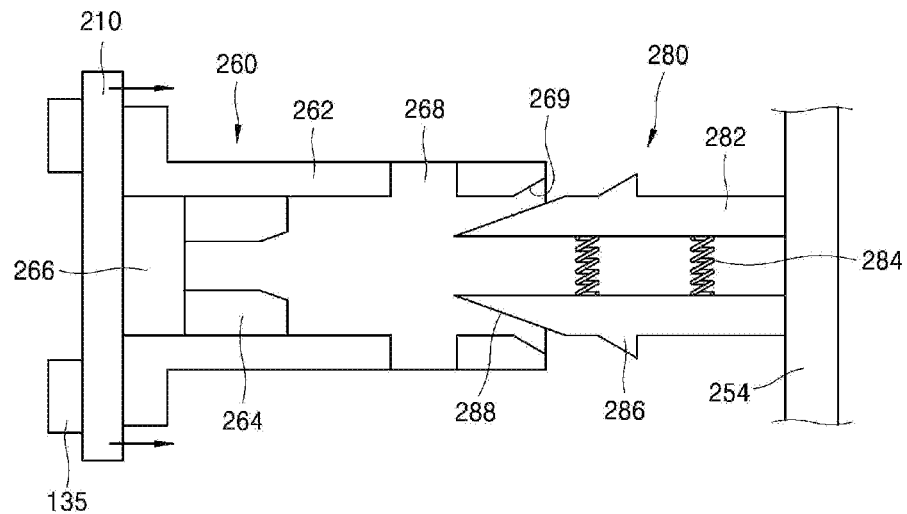
FIGS. 12A to 12D are views illustrating methods for tiling and detiling a display panel to and from the tiled display device by the tiling apparatus in accordance with the second embodiment of the present disclosure.

First, as shown in FIG. 12A, in a state in which the display panel 210 is attached to the first magnet 135 of the tiling apparatus 120, as the display panel 210 is moved toward the plate 254 of the tiled display device, the coupling bars 282 of the second coupling unit 280 are inserted into the body 262 of the first coupling unit 260.

Figure 12B:
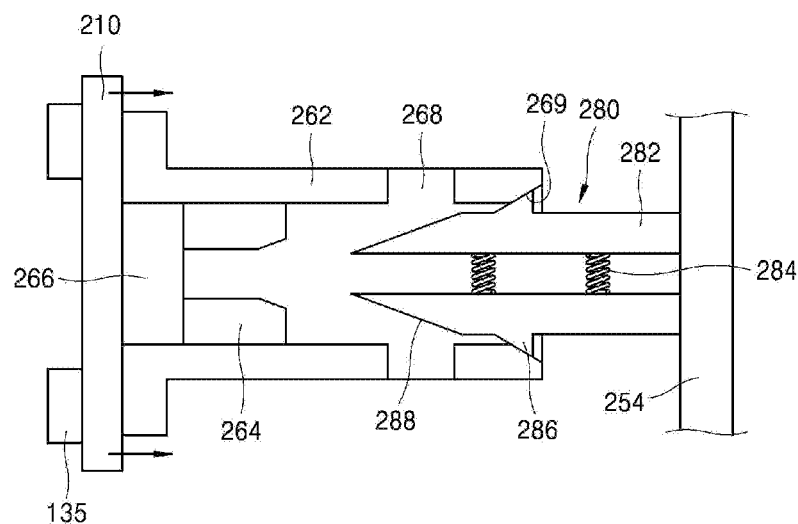

Then, as shown in FIG. 12B, as the display panel 210 attached to the tiling apparatus 120 is further moved forward toward the plate 254, the coupling protrusions 286 formed on the coupling bars 282 come into contact with the inclined portion 269 of the first coupling unit 260. The inclined portion 269 is inclined by the predetermined angle, and the coupling protrusions 286 are also constructed by triangular shapes which have inclined portions. Therefore, the inclined regions of the coupling protrusions 286 and the inclined portion 269 come into contact with each other. As the display panel 210 is moved forward toward the plate 254, the coupling protrusions 286 are moved along the inclined region of the inclined portion 269, and the spacing between the pair of coupling bars 282 is narrowed, by which the coupling protrusions 286 may be introduced into the body 262. When the spacing between the pair of coupling bars 282 is narrowed, both the coupling bars 282 may be moved, or the pair of coupling bars 282 may be constructed such that only one of them is fixed to the plate 254 and only the other of them is moved.

Figure 12C:
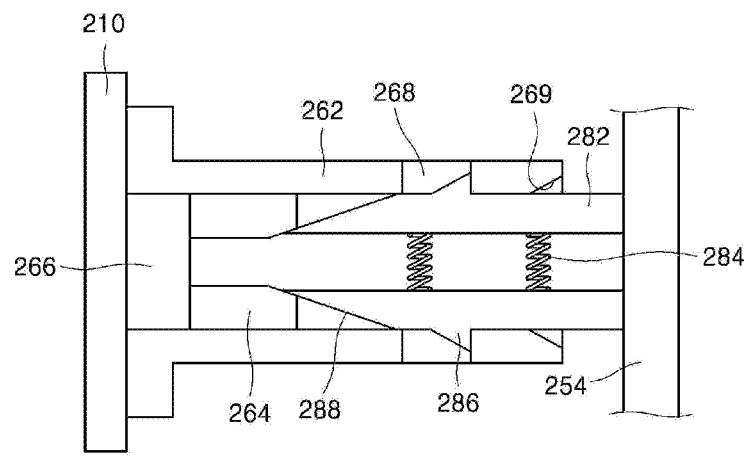

As shown in FIG. 12C, in the state in which the coupling protrusions 286 are introduced into the inside of the body 262, as the display panel 210 is continuously moved forward toward the plate 254 and the coupling protrusions 286 reach the coupling portion 268, the coupling protrusions 286 are hooked into the coupling portion 268 by the elasticity of the springs 284 disposed between the pair of coupling bars 282, and thus, the display panel 210 is tiled to the plate 254.

By tiling a plurality of display panels 210 to the plate 254 through repeating the above-described process, the tiled display device is completed.

Figure 12D:
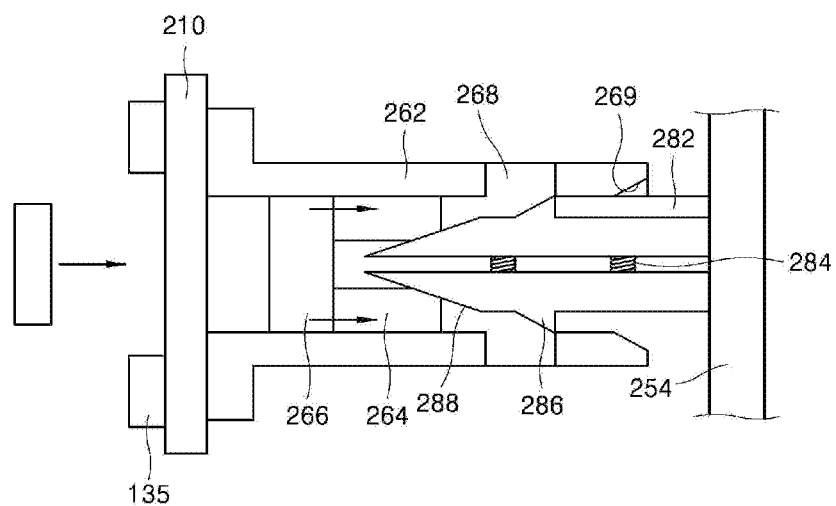

Meanwhile, in the case of detaching the display panel 210 from the tiled display device, as shown in FIG. 12D, in a state in which the tiled display panel 210 is attached to the tiling apparatus 120 by the first magnet 135, as the second magnet 137 is moved to the front of the display panel 210 by actuating the second driving member 127, because the regions of the second magnet 137 and the tiling magnet 266 which face each other have the same polarity, the tiling magnet 266 is moved toward the plate 254 (that is, in a direction facing away from the display panel 210) in the body 262 of the first coupling unit 260 by a magnetic repulsive force.

As the tiling magnet 266 is moved, the movable bar 264 is also moved. The movable bar 264 is moved in a state in which it is brought into contact with the inclined distal end portions 288 of the pair of coupling bars 282. Therefore, as the movable bar 264 is moved, since the spacing of the pair of coupling bars 282 is narrowed and the coupled state of the coupling protrusions 286 and the coupling portion 268 is released, the display panel 210 may be detached from the plate 254 of the tiled display device.

In the tiled display device in accordance with the present embodiment, as the coupling protrusions 286 are formed on the plate 254 of the tiled display device and the coupling portion 268 is formed in the display panel 210, the display panel 210 is tiled by the hooking of the coupling protrusions 286 and the coupling portion 268. By pushing inward the display panel 210 attached to the tiling apparatus 120, in front of the plate 254, the coupling protrusions 286 and the coupling portion 268 are automatically hooked with each other, by which the display panel 210 is tiled. Therefore, in the present embodiment, without a mechanical manipulation such as assembling of screws for tiling, the display panel 210 may be tiled as the worker simply attaches the display panel 210 fixed to the tiling apparatus 120, automatically to the plate 254 in front of the tiled display device. Accordingly, the tiling of the display panel 210 may be quickly and easily performed by a small number of workers.

Also, in the present embodiment, since the display panel 210 may be detached, without using an additional mechanism, by simply attaching the tiling apparatus 120 to the display panel 210 of the tiled display device and then actuating the second driving member 127, it is possible to quickly and easily disassemble the tiled display device.

Figure 13:
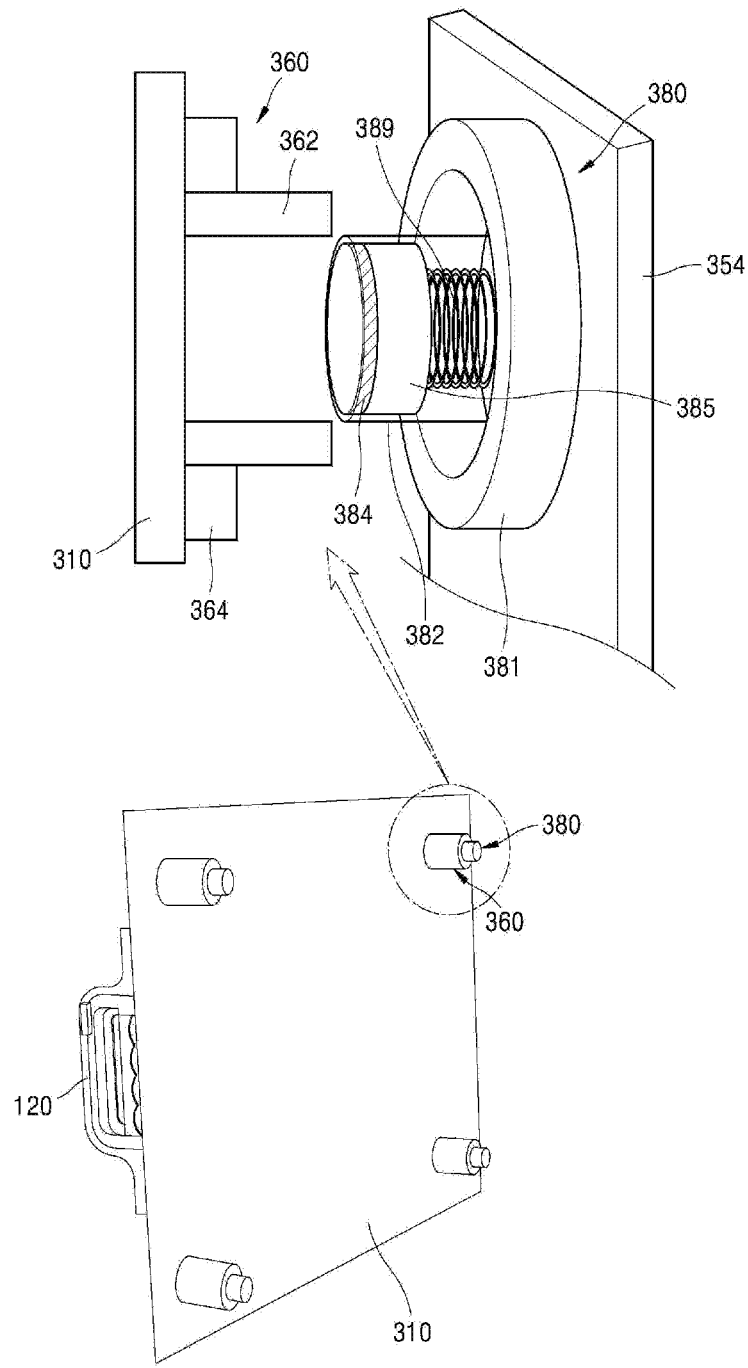
FIG. 13 is a view illustrating a tiled display device in accordance with a third embodiment of the present disclosure.

FIG. 13 is a view illustrating a tiled display device in accordance with a third embodiment of the present disclosure. Hereinbelow, descriptions for the same structure as that of the first embodiment will be omitted or be briefly made, and detailed descriptions will be made for a different structure. Since the schematic structure of the tiled display device is the same as that shown in FIG. 1, a coupling structure in which a display panel 310 and a plate 354 of the tiled display device are coupled with each other is specifically shown in the drawing.

As shown in FIG. 13, a first coupling unit 360 is disposed around each corners on the rear side of the display panel 310, and a second coupling unit 380 corresponding to the first coupling unit 360 is disposed on the front side of the plate 354 of the tiled display device.

The first coupling unit 360 and the second coupling unit 380 not only tile the display panel 310 to the plate 354 of the tiled display device by being coupled with each other, but also align the display panel 310 to be tiled, with the plate 354.

The first coupling unit 360 is constructed by a cylindrical body 362 and an attachment member 364 which is formed around the outer circumference of the body 362 and is made of a ferromagnetic material such as iron and nickel. However, it is to be noted that the embodiment is not limited thereto, and an additional magnet may be fixed to the distal end of the attachment member 364 or the attachment member 364 may be a magnet.

The second coupling unit 380 is constructed by a first coupling magnet 381 which is constructed into a cylindrical shape and attaches the attachment member 364 of the first coupling unit 360, a guide 382 which is inserted into the body 362 of the first coupling unit 360 and has a cylindrical shape, a movable member 385 which is movably inserted into the guide 382, and a second coupling magnet 384 which is provided to the distal end of the movable member 385.

The movable member 385 is connected with the plate 354 through an elastic member 389, is movably disposed in the guide 382, and is returned to a preset position by the elasticity of the elastic member 389.

The diameter of the cylindrical shape of the first coupling magnet 381 of the second coupling unit 380 is set to be larger than the diameter of the body 362 of the first coupling unit 360. Therefore, when the first coupling unit 360 and the second coupling unit 380 are coupled, the body 362 is disposed inside the first coupling magnet 381, and the attachment member 364 is attached to the first coupling magnet 381. The diameter of the guide 382 of the second coupling unit 380 is set to be smaller than the diameter of the body 362 of the first coupling unit 360. Therefore, when the first coupling unit 360 and the second coupling unit 380 are coupled, the guide 382 is disposed inside the cylindrical shape of the body 362, and the display panel 310 is attached to the second coupling magnet 384.

The second coupling magnet 384 of the second coupling unit 380 cooperates with the second magnet 137 of the tiling apparatus 120, and thereby detaches the tiled display panel 310 from the plate 354.

Figure 14A:
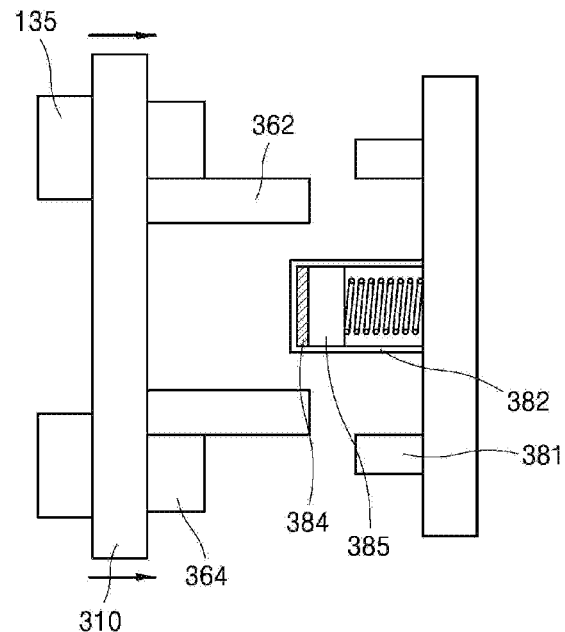
FIGS. 14A and 14B are views illustrating methods for tiling and detiling a display panel to and from the tiled display device by the tiling apparatus in accordance with the third embodiment of the present disclosure.
Figure 14B:
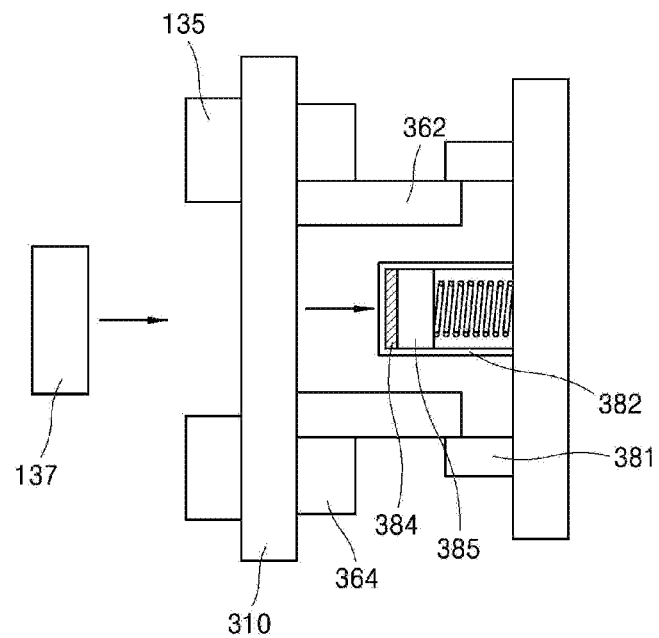

FIGS. 14a and 14b are views illustrating methods for tiling and detiling the display panel 310 to and from the tiled display device by the tiling apparatus in accordance with the present embodiment.

As shown in FIG. 14A, in a state in which the display panel 310 is attached to the first magnet 135 of the tiling apparatus 120, as the display panel 310 is moved toward the plate 354 of the tiled display device, the body 362 of the first coupling unit 360 is inserted into the inside of the first coupling magnet 381 of the second coupling unit 380, and the attachment member 364 is attached to the first coupling magnet 381 of the second coupling unit 380. At the same time, the guide 382 of the second coupling unit 380 is inserted into the body 362 of the first coupling unit 360, and the rear side of the display panel 310 is attached to the second coupling magnet 384, by which the first coupling unit 360 and the second coupling unit 380 are coupled with each other.

In this state, as the first magnet 135 is moved in a direction facing away from the display panel 310 by actuating the first driving member 125 of the tiling apparatus 120, because the sum of the attachment force of the attachment member 364 of the first coupling unit 360 and the first coupling magnet 381 of the second coupling unit 380 and the attachment force of the second coupling magnet 384 of the second coupling unit 380 and the display panel 310 is larger than the attachment force of the first magnet 135 of the tiling apparatus 120 and the display panel 310, the tiling apparatus 120 is separated from the display panel 310 in the state in which the display panel 310 is attached to the plate 354.

By tiling a plurality of display panels 310 to the plate 354 through repeating the above-described process, the tiled display device is completed.

As shown in FIG. 14B, in the state in which the tiled display panel 310 is attached to the tiling apparatus 120 by the first magnet 135, as the second magnet 137 is moved to the front of the display panel 310 by actuating the second driving member 127, because the regions of the second magnet 137 and the second coupling magnet 384 which face each other have the same polarity, the second coupling magnet 384 is separated from the display panel 310 by a magnetic repulsive force, and the second coupling magnet 384 and the movable member 385 are moved toward the plate 354.

Since the attachment force of the first magnet 135 of the tiling apparatus 120 and the display panel 310 is larger than the attachment force of the first coupling magnet 381, the display panel 310 is detached from the plate 354 by the tiling apparatus 120.

As described above, in the tiled display device in accordance with the present embodiment, the display panel 310 is tiled and separated (detiled) by the magnetic forces of the magnets 135 and 137 of the tiling apparatus 120 and the magnets 381 and 384 of the second coupling unit 380 disposed in the plate 354. Therefore, without a mechanical manipulation such as assembling of screws for tiling, a worker may simply attach the display panel 310 fixed to the tiling apparatus 120 and detach the display panel 310 in front of the tiled display device. Accordingly, the tiling and de-tiling of the display panel 310 may be quickly and easily performed by a small number of workers.

The embodiments of the present disclosure can also be described as follows:

Embodiments relate to a display including a display panel having elements. The display includes a display panel having elements that allow attachment to a mounting structure therebehind and in alignment with adjacent display panels that collectively form a tiled display screen that has multiple display panels connected to each other with effectively seamless bezels, The elements are configured to allow the display panel to be attached to or detached from the tiled display screen in a particular direction other than a side direction that would only allow for engagement from the sides of the adjacent display panels.

In one embodiment, the particular direction is substantially perpendicular to an upper surface of the display panel.

In one embodiment, the elements are configured to have a male-to-female engaging relationship with the mounting structure and to facilitate attachment or detachment via a spring-biased mechanism.

In one embodiment, the elements are made of metallic material that reacts to magnets in a mounting device used for the attachment or detachment of the display panel to the mounting structure.

In one embodiment, the elements are further configured to include magnets, which exhibit magnetic forces that act in cooperation with the spring-biased mechanism to achieve the attachment or detachment with the mounting structure.

In one embodiment, the elements include cylindrical mounts that engage with corresponding cylindrical posts at the mounting structure.

In one embodiment, the elements are located near at least four corners of the display panel.

Embodiments also relate to a tiling apparatus including a frame, at least one first magnet, at least one second magnet, a first actuation member, and a second actuation member. The at least one first magnet at the frame allows attachment to a display panel and the at least one second magnet at the frame allows detachment from the display panel previously attached to the frame. The first actuation member is configured to actuate the first magnet during attachment and the second actuation member is configured to actuate the second magnet during detachment.

In one embodiment, the tiling apparatus further include a first pressure bar and a second pressure bar. The first pressure bar is coupled with the first actuation member and the first magnet and the second pressure bar is coupled with the second actuation member and the second magnet.

In one embodiment, the tiling apparatus further include a pair of support bars on both sides of the frame and one or more handles at each of the support bars.

In one embodiment, the first driving member is located below the handle.

In one embodiment, the second driving member is projected from the handle.

Embodiments also relate to a tiled display device including a plurality of display panels, a plate to which the plurality of display panels are attached in a tiled manner, a first coupling unit on a rear side of each display panel, and a second coupling unit on a front side of the plate. The second coupling unit is operatively attachable or detachable with the first coupling unit. At least on among the first coupling unit and the second coupling unit includes a magnet.

In one embodiment, the first coupling unit includes a body having a cylindrical shape to guide the second coupling unit received therein and a coupling groove formed on an inner surface of the body.

In one embodiment, the second coupling unit includes a guide on the plate, a movable member in the guide, a first tiling magnet at an end portion of the movable member, a receiving groove in the movable member, an elastic member between the plate and the movable member, and a coupling protrusion in the guide. The guide is received in the body of the first coupling unit and the movable member is received in the body of the first coupling unit and the movable member is movable in the body of the first coupling unit. the first tiling magnet is used to secure the display panel and the coupling protrusion is operatively coupled into the coupling groove of the first coupling unit.

In one embodiment, the coupling protrusion includes a plurality of ball elements located along a circumference of the guide.

In one embodiment, upon attachment of the display panel to the plate, the second coupling unit is received in the first coupling unit and the movable member is moved. The coupling protrusion is received in the receiving groove of the movable member and coupled to the coupling groove.

In one embodiment, upon detachment of the display panel from the plate, the second coupling unit is separated from the first coupling unit and the movable member is moved. The coupling protrusion is received in the receiving groove of the movable member and decoupled from the coupling groove.

In one embodiment, the tiled display device further includes a second tiling magnet at an end portion of the body of the first coupling unit, and cooperating with the first tiling magnet to move the movable member, when the first coupling unit and the second coupling unit are coupled with each other.

In one embodiment, the first coupling unit includes a body having a cylindrical shape to guide the second coupling unit received therein, a tiling magnet movably disposed in the body, a movable bar along an inner circumference of the body and moved as the tiling magnet is moved, a coupling groove in the body, and an inclined portion at an end of the body.

In one embodiment, the second coupling unit includes a pair of coupling bars on the plate, a spring between the pair of coupling bars, coupling protrusions on the pair of coupling bars, respectively, and coupled into the coupling groove of the first coupling unit, and distal end portions at distal ends of the pair of coupling bars and inclined by a particular angle.

In one embodiment, the distal end portions of the second coupling unit are moved along the inclined portion of the first coupling unit when the second coupling unit is inserted into the first coupling unit, so that the second coupling unit is moved in a state in which a spacing between the pair of coupling bars is narrowed and then the coupling protrusions are coupled into the coupling groove.

In one embodiment, the tiling magnet and the movable bar are moved when the second coupling unit is separated from the first coupling unit, so that the movable bar is moved along inclined surfaces of the distal end portions of the second coupling unit and then the spacing between the pair of coupling bars is narrowed and coupling of the coupling protrusions, thereby the coupling protrusions are released from the coupling groove.

In one embodiment, the first coupling unit includes a body having a circular cylindrical shape to guide the second coupling unit inserted therein and an attachment member formed along an outer circumference of the body.

In one embodiment, the second coupling unit includes a first coupling magnet having a cylindrical ring shape and disposed on the plate and a second coupling magnet disposed at a center of the cylindrical ring shape and having a circular shape.

In one embodiment, the attachment member is made of a ferromagnetic material.

Embodiments also relate to a display panel mounting device including a body with handles and a mounting element, operatively connected to the body. The mounting element is attachable to a display panel due to magnetic forces from magnets in the mounting element upon engagement with metallic elements in the display panel. And the mounting element is detachable from the display panel upon disengagement from the metallic elements via a mechanism activated at the handles.

In one embodiment, the magnets additionally act on a mounting structure, which is behind the display panel, that can be engaged or disengaged with the metallic elements in the display panel.

In one embodiment, the body and mounting element allow the display panel to be attached to or detached from a tiled display screen, which has multiple display panels connected to each other with effectively seamless bezels, in a particular direction other than a lateral direction that would only allow for slide attachment of the display panel from a side of an adjacent display panel.

In one embodiment, the particular direction is substantially perpendicular to an upper surface of the display panel.

In one embodiment, the mounting element is located on the body at positions corresponding to each corner of the display panel.

In one embodiment, the mounting element further comprises a spring-biased mechanism that cooperates with the magnets for engaging and disengaging with the display panel.

In one embodiment, the display panel mounting device further includes an optical or visual verification mechanism attached to the body to allow verification of attachment or detachment of the display panel.

Embodiments also relate to a tiled display device including a first substrate having a front surface to which a display panel is attached, a second substrate facing a rear surface of the first substrate, a receiving protrusion disposed to the rear surface of the first substrate, a guide disposed to a front surface of the second substrate, an elastic member disposed in the guide and having one end portion which is fixed to the front surface of the second substrate, a movable member disposed in the guide and connected with the other end portion of the elastic member, and a first magnet disposed to one end portion of the movable member facing to the rear surface of the first substrate. The first substrate is fixed to the second substrate by coupling the receiving protrusion and the guide.

In one embodiment, the rear surface of the first substrate includes a metallic material which reacts with magnetism.

In one embodiment, the first magnet is attached with the first substrate as the guide is coupled with the receiving protrusion.

In one embodiment, the movable member is moved in a direction facing the second substrate as the guide is separated from the receiving protrusion.

In one embodiment, the guide includes a plurality of through holes.

In one embodiment, the through holes are arranged along a circumference of a cross-section of the guide.

In one embodiment, the guide further includes coupling elements disposed in the through holes, respectively, and a thickness of each coupling element is larger than a depth of each through hole.

In one embodiment, the movable member includes a receiving groove formed on an outer wall thereof and the receiving protrusion includes a coupling groove formed on an inner wall thereof.

In one embodiment, at least a parts of the coupling elements are disposed in the coupling groove as the guide is coupled with the receiving protrusion.

In one embodiment, at least a part of the coupling elements are disposed in the receiving groove as the guide is separated from the receiving protrusion.

In one embodiment, the display panel includes a LED display panel.

Embodiments also relate to a tiled display device including a first substrate having a front surface to which a display panel is attached, a second substrate facing a rear surface of the first substrate, a receiving protrusion disposed on the rear surface of the first substrate, a coupling unit formed in the receiving protrusion, at least one pair of coupling bars disposed on a front surface of the second substrate, coupling protrusions formed on the coupling bars, and at least one elastic member disposed between the pair of coupling bars. The first substrate is fixed to the second substrate by coupling the coupling protrusions to the coupling portion.

In one embodiment, an end portion of the receiving protrusion has a shape inclined toward an inside of the receiving protrusion.

In one embodiment, the inclined end portion of the receiving protrusion comes into contact with the coupling protrusions as the coupling bars are coupled with the receiving protrusion.

In one embodiment, the pair of coupling bars include a first coupling bar and a second coupling bar, and the first coupling bar is moved such that a spacing between the first coupling bar and the second coupling bar is narrowed as the coupling bars are coupled with the receiving protrusion.

In one embodiment, the tiled display device further includes a tiling magnet and a movable bar disposed in the receiving protrusion. The movable bar and the tiling magnet are moved together by an external magnetic force.

In one embodiment, an end portion of the movable bar has an inclined shape.

In one embodiment, the pair of coupling bars include a first coupling bar and a second coupling bar, and a spacing between the first coupling bar and the second coupling bar is narrowed as the tiling magnet is moved in a direction facing the second substrate.

Embodiments also relate to tiling apparatus including a frame, at least one first magnet disposed in the frame and attaching a display panel, at least one second magnet disposed in the frame and separating the attached display panel, a first driving member configured to move the first magnet toward the display panel, and a second driving member configured to move the second magnet away from the display panel. The tiling apparatus couples the display panel to said tiled display device.

In one embodiment, the tiling magnet of claim 5 moves the movable bar toward the second substrate as the first magnet attaches the display panel.

Embodiments also relate to a tiled display device including a plurality of first frames for supporting at least one display panel, second frames coupled with the plurality of first frames, a plurality of first protrusions protruding on each of the first frame toward the second frame, a plurality of second protrusions protruding on the second frame toward the first frame, a plurality of first magnets disposed on the first frame, and a plurality of second magnets disposed on the second frame. The first protrusions are coupled with the corresponding second protrusions to fix the first frames to the second frame.

In one embodiment, the tiled display device further includes an elastic member disposed in each of the second protrusion. One end portion of the elastic member is fixed to the second frame.

In one embodiment, the tiled display device further includes a third magnet fixed to the other end portion of each of the elastic member.

In one embodiment, the first protrusions are coupled to the corresponding second protrusions so that the third magnet is attached to the first frame, and the first frames are fixed to the second frame.

In one embodiment, the first magnet is disposed outside each of the first protrusion.

In one embodiment, the first protrusions are coupled to the corresponding second protrusion so that the first magnet is attached to the second magnet, and the first frames are fixed to the second frame.

In one embodiment, the first magnet is disposed outside each of the first protrusion.

In one embodiment, the first protrusions are coupled to the corresponding second protrusion so that the first magnet is attached to the second magnet, and the first frames are fixed to the second frame.

In one embodiment, an end portion of the first protrusion is positioned between the second protrusion and the second magnet.

In one embodiment, the second magnet has a ring shape.

In one embodiment, the second protrusion is disposed inside the shape of each of the second magnet.

In one embodiment, the first frames are separated from the second frame so that the third magnet is moved by an external magnetic repulsive force in such a way as to be distant from the first frame and close to the second frame.

It will be apparent to those skilled in the art that various modifications and variations can be made in the tiled display device and tiling apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A tiled display device, comprising:
   a plurality of display panels;
   a plate to which the plurality of display panels are attached in a tiled manner;
   a first coupling unit on a rear side of each display panel; and
   a second coupling unit on a front side of the plate and operatively attachable or detachable with the first coupling unit,
   wherein at least one among the first coupling unit and the second coupling unit includes a magnet, and wherein the first coupling unit comprises:
      a body having a cylindrical shape to guide the second coupling unit received therein; and
      a coupling groove on an inner surface of the body.

2. The tiled display device according to claim 1, wherein the rear surface of the display panel includes a metallic material which reacts with magnetism.

3. The tiled display device according to claim 1, wherein the display panel includes a LED display panel.

4. The tiled display device according to claim 1, wherein the second coupling unit comprises:
   a guide on the plate and received in the body of the first coupling unit;
   a movable member in the guide, the movable member being received in the body of the first coupling unit and movable therein;
   a first tiling magnet at an end portion of the movable member and used to secure the display panel; and
   an elastic member between the plate and the movable member.

5. The tiled display device according to claim 4, further comprising:
   a second tiling magnet at an end portion of the body of the first coupling unit, and cooperating with the first tiling magnet to move the movable member, when the first coupling unit and the second coupling unit are coupled with each other.

6. The tiled display device according to claim 4, wherein the first tiling magnet is attached with the display panel as the guide is coupled with the body.

7. The tiled display device according to claim 4, wherein the movable member is moved in a direction facing the plate as the guide is separated from the body.

8. The tiled display device according to claim 4, wherein the guide includes a plurality of through holes.

9. The tiled display device according to claim 8, wherein the through holes are arranged along a circumference of a cross-section of the guide.

10. The tiled display device according to claim 8, wherein the guide further includes coupling members disposed in the through holes, respectively, and a thickness of each coupling members is larger than a depth of each through hole.

11. The tiled display device according to claim 10, wherein the movable member includes a receiving groove formed on an outer wall thereof.

12. The tiled display device according to claim 11, wherein at least a part of the coupling members are disposed in the coupling groove as the guide is coupled with the body.

13. The tiled display device according to claim 11, wherein at least a part of the coupling members are disposed in the receiving groove as the guide is coupled with the body.

14. The tiled display device according to claim 11, wherein, upon attachment of the display panel to the plate, the second coupling unit is received in the first coupling unit, the movable member is moved and the coupling member is received in the receiving groove of the movable member and coupled to the coupling groove.

15. The tiled display device according to claim 11, wherein, upon detachment of the display panel from the plate, the second coupling unit is separated from the first coupling unit, the movable member is moved, and the coupling member is received in the receiving groove of the movable member and decoupled from the coupling groove.

* * * * *